United States Patent [19]
Kazawa et al.

[11] Patent Number: 5,267,267
[45] Date of Patent: Nov. 30, 1993

[54] TIMING EXTRACTION METHOD AND COMMUNICATION SYSTEM

[75] Inventors: Tohru Kazawa, Kokubunji; Takanori Miyamoto, Fuchu; Toshiroh Suzuki, Tama; Shigeo Nishita, Sakai; Ichiro Massé, Yokohama; Takashi Morita, Yokohama; Souichi Yamashita, Yokohama, all of Japan

[73] Assignee: Hitachi, Ltd., Tokyo, Japan

[21] Appl. No.: 845,196

[22] Filed: Mar. 3, 1992

Related U.S. Application Data

[63] Continuation of Ser. No. 492,059, Mar. 12, 1990, Pat. No. 5,123,030.

[30] Foreign Application Priority Data

Mar. 13, 1989 [JP] Japan .................................. 1-57702
Jun. 5, 1989 [JP] Japan ................................. 1-141016

[51] Int. Cl.$^5$ .................................................. H04L 25/49
[52] U.S. Cl. .................................. 375/20; 375/110; 375/116; 375/118; 370/105.3; 370/105.4
[58] Field of Search ............... 375/17, 20, 110, 114, 375/116, 120, 118; 370/84, 105.3, 105.4; 307/271, 354, 360, 362; 379/93, 97, 98

[56] References Cited

U.S. PATENT DOCUMENTS

| | | | |
|---|---|---|---|
| 3,978,284 | 8/1976 | Yoshino et al. | 375/20 |
| 4,010,421 | 3/1977 | Lind | 375/20 |
| 4,351,061 | 9/1982 | Hedin et al. | 375/20 |
| 4,355,408 | 10/1982 | Scarrott | 375/110 |
| 4,367,495 | 1/1983 | Mita et al. | 375/18 |
| 4,386,323 | 5/1983 | Jansen | 375/119 |
| 4,584,690 | 4/1986 | Cafiero et al. | 375/18 |
| 4,775,984 | 10/1988 | Jaffre et al. | 375/17 |
| 4,775,989 | 10/1988 | Takatori et al. | 375/110 |
| 4,912,726 | 3/1990 | Iwamatsu et al. | 375/20 |
| 4,924,492 | 5/1990 | Gitlin et al. | 375/93 |

*Primary Examiner*—Curtis Kuntz
*Assistant Examiner*—Young Tse
*Attorney, Agent, or Firm*—Fay, Sharpe, Beall, Fagan, Minnich & McKee

[57] ABSTRACT

Clock timing is extracted from N level, multilevel codes of megabits per second data by determining a baud clock among the N−1 possible clocks synchronized to all the level cross points. A discriminator is used with a clock and if correct information is not obtained, the clock is changed.

12 Claims, 18 Drawing Sheets

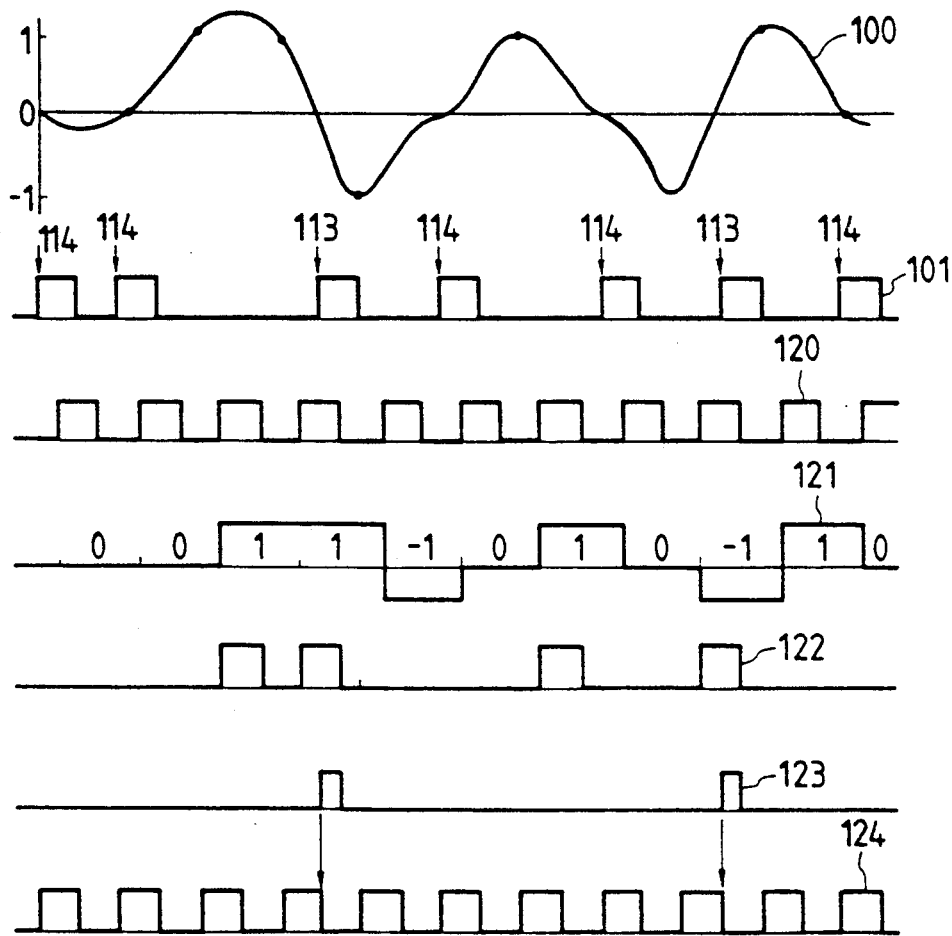

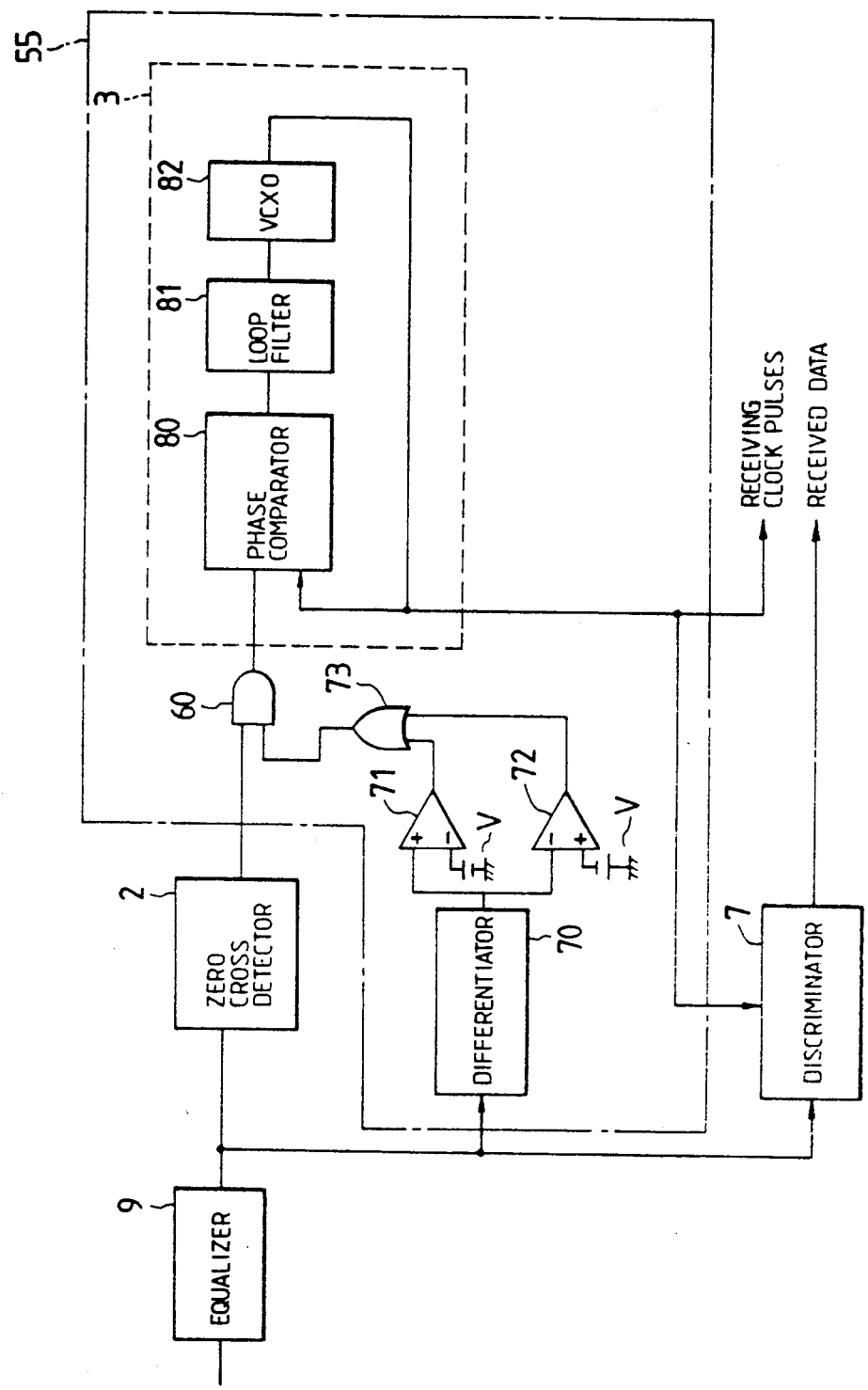

TIMING EXTRACTION METHOD AND COMMUNICATION SYSTEM

This is a continuation of application Ser. No. 07/492,059, filed Mar. 12, 1990, now U.S. Pat. No. 5,123,030 issued Jun. 16, 1992.

BACKGROUND

The present invention relates to a digital communication system, and more particularly to a communication system which is suited to perform high-speed transmission above several megabits per second between an exchanger and terminals by using telephone wire as a transmission medium.

In a digital communication system, received data is acquired by discriminating a received waveform in synchronism with a reference clock pulse train. To this end, a technique for producing the reference clock pulses from the received waveform, that is, a method of extracting timing signals, becomes important. In a system for high-speed digital transmission above several megabits per second wherein telephone wire is used, signal attenuation in the telephone wire is high, and also crosstalk noise is high, so that the use of a multilevel transmission code of narrow data rate range is desirable. As to the extraction of the timings under such conditions, an LC tank circuit has been known, by way of example. In order to extract the necessary clock pulses with, for example, the partial response class-4 code, "PR4 code", the received signal is raised to the fourth power, and the biquadrate is applied to the LC tank circuit.

On the other hand, regarding digital transmission of low speed, there has been known a method wherein the received waveform is converted by an A/D converter into digital data, which are subjected to correlative operations so as to extract the timings.

A zero cross detection method has been known which is applicable to the high-speed transmission and which can be realized by comparatively simple hardware. By way of example, "IEEE NTC 1980, 65. 4" discloses a method wherein the timings of zero cross points are detected by a discriminator having a threshold level of 0 volt, and these signals are input to a phase locked loop "PLL", to extract the timing clock pulses. This method is extensively applied to the data transmission of 2-level codes.

Also, a method in which a PLL is used after full-wave rectification has been proposed for the purpose of applying it to the 3-level AMI code. This method is disclosed in Technical Report on Communication Systems CS81-187, the Institute of Electronics, Information and Communication Engineers in Japan.

SUMMARY

Among the prior-art techniques mentioned above, the method employing the LC tank circuit is difficult for integrated circuit implementation because a coil is used, and it necessitates manual adjustments because dispersions in the values of coil and capacitor elements affect characteristics. Especially in the case of the PR4, the method has the disadvantage that a double square circuit is required, so a circuit becomes complicated.

In addition, regarding the method which employs the A/D converter of for example 8 bits or more and which executes the correlative operations, there has not been obtained an A/D converter of high enough speed to be applied to a transmission speed on the order of megabits per second.

Further, the zero cross detection method has the problem that it is not applicable to the multilevel transmission code. An example of the received two-level transmission code is shown in FIG. 22. When the trailing edges of clock pulses 302 are synchronized with the zero cross points 305 of a 2-level signal 301 without fail, the leading edges of the clock pulses 302 become correct discriminative points. In contrast, when clock pulses are intended to be synchronized with the zero cross points 306a and 306b of the received waveform 303 of a 3-level code being one example of the multilevel code, there arise two trains of clock pulses consisting of a train of clock pulses 304a whose trailing edges are synchronous to the zero crosses 306a, and a train of clock pulses 304b whose trailing edges are synchronous to the zero crosses 306b. In acutality, the clock pulses 304a or 304b or clock pulses in a phase intermediate between the phases of the clock pulses 304a and 304b happen to be output in accordance with the probabilities of appearance of the zero cross points 306a and 306b, resulting in the problem that data items cannot be correctly discriminated. In general, when an N-level code is used, there is the possibility that (N−1) trains of clock pulses in different phases will arise. On this occasion, stable clock pulses cannot be output with the zero cross detection method in the prior art.

The method employing a full-wave rectifier circuit and the PLL is, in principle, applicable to the multilevel code. However, degradation in accuracy is involved in the nonlinear processing of the full-wave rectification, and it is often impossible to realize an accuracy sufficient in practical use.

An object of the present invention is to provide a timing extraction method which can extract correct clock pulses when a multilevel transmission code is applied, which is applicable even to high-speed transmission above several megabits per second, with a circuit which is suited to LSI implementation.

Methods for accomplishing the object are broadly classified into two. One of the methods is a method in which only zero cross timings that coincide with discriminative points are first distinguished from among (N−1) sorts of zero crossing timings, and the timing information items thereof are subsequently input to a PLL, thereby to obtain baud clock pulses. The other is a method in which all of (N−1) sorts of zero cross timings are first synchronized with clock pulses whose frequency is (N−1) times higher than a baud, by the use of a PLL, and one train of clock pulses is subsequently distinguished from among (N−1) trains of baud clock pulses which are obtained by dividing the frequency of the (N−1) times clock pulses and which differ in phase from one another. On this occasion, a specified bit string reflective of a property peculiar to a code, or a frame synchronization pattern, a training pattern or the like is employed for the distinguishing operation.

By the way of example, the following methods can be applied to the distinction in the former method. The first is a method in which zero crosses are selected only when a specified bit string reflective of a property peculiar to a code has been received. The second is a method in which zero crosses are selected only when a gradient of a signal is maximum. The gradient of a signal can be detected by utilizing, for example, a differentiator. A differentiator as used herein converts the multilevel received code into digital information representing the levels. The third is a method in which all the zero cross timing information items are sent to the PLL, whereupon unnecessary zero cross timing information items are subtracted.

Among the aforementioned methods, there will be first explained a method in which the baud clock pulses are generated by the PLL after the distinction of one train of zero cross timings.

In the first distinguishing method stated before, only the desired zero cross timings are distinguished in accordance with the specified pattern. With a correlative code, for example, the PR4 code, whether a zero cross point appears in the next time slot can be decided sometimes from the discriminative pattern received in the past. The zero cross point either coincides with a discriminative point or lies at the middle of two discriminative points. Therefore, when the zero cross timing is detected for a time interval approximately equal to a half time slot since the reception of the specified pattern, only the zero cross timing lying at the middle of the discriminative points can be detected.

In the second distinguishing method stated before, the zero cross points are assorted and distinguished according to the gradients of a waveform. The gradient, namely, the rate of change can be known by passing the signal through a differentiator. In general, a multilevel code exhibits the greater gradient when it changes from a plus peak to a minus peak. The zero cross point which appears at this time lies just at the middle point of discriminative points, and this is convenient for the reason stated in relation to the first method. Therefore, only the zero cross timings at the middle of the discriminative points can be distinguished in such a way that the output voltage of the differentiator is monitored, and that the zero cross detection is done only when a certain level has been exceeded.

In the third distinguishing method, the information items of the unnecessary zero cross points are subtracted later. In the case where the PLL is employed for clock pulse generation, the phase of the zero cross timing and that of an output clock pulse from a VCXO are first compared by a phase comparator, and the resulting phase difference is stored and smoothed by the loop filter, whereupon the output clock pulse of the VCXO is controlled. There is a time lag between the control of the output clock pulse of the VCXO and the input of the zero cross timing. By way of example, the phase difference obtained from all the zero cross timings is input to the loop filter first, and a phase difference ascribable to the zero cross timings which do not correspond to the middle of discriminative points is subtracted in the time lag. Thus, the same effect as in inputting only the desired zero cross timings from the beginning is attained.

Next, there will be explained the method in which all the zero cross points are synchronized using the clock pulses at the frequency (N−1) times higher than the baud, and then one of the (N−1) trains of baud clock pulses is distinguished by using the specified bit string reflecting the peculiar property of the code employed. When, in distinguishing the zero cross timings, the zero cross timing which lies just at the middle of two adjacent discriminative points is to be distinguished, the synchronization of the trailing edge of the baud clock pulse with the above timing is convenient because then the leading edge of the clock pulse coincides with the discriminative point. Such a zero cross point appears, for example, midway of the change of the signal from "1" to "−1". In other words, the desired zero cross point is determined by detecting a pattern in which values at the two adjacent discriminative points have the same absolute value and the opposite signs. The baud clock pulse trains are changed-over in succession while the appearance of the zero cross point and the discriminative values of the two points are being monitored, and if the pattern described above can be detected at the appearance of the zero cross point, the clock pulse train on that occasion can be decided as being correct.

On the other hand, if a pattern which cannot occur in view of the correlatively of the code is detected, the baud-rate clock pulse train on that occasion can be decided as being erroneous. By way of example, such patterns as "1, 1, 1" and "−1, −1, −1" or "1, −1, 1" and "−1, 1, −1" do not occur with the PR4 code. If the code-side violation pattern as mentioned above is detected from the values discriminated with a certain baud clock pulse train, the baud clock pulse train is erroneous.

Further, a frame synchronization pattern can be utilized for the distinction. In this case, when data has been discriminated at an erroneous timing, a different frame synchronization pattern ought to be detected. Accordingly, the frame synchronization pattern should desirably be a pattern in which the same values do not succeed each other. When the same values do succeed each other, it is sometimes the case that the discriminative value does not change in spite of the shift of the discriminative timing, so an error cannot be detected. In particular, when the frame synchronization pattern containing "1, −1" or "−1, 1" is employed, "1, 1" is discriminated with the clock pulses in the correct phase, whereas "0" appears without fail with the clock pulses in a phase shifting by a half cycle, so that whether the clock pulses are correct or erroneous can be easily decided.

In the ways thus far described, whether a certain baud clock pulse train is correct or erroneous can be decided when it has been distinguished. Since the alternative clock pulse trains to be distinguished are in the number of (N−1), a discriminator is operated while the clock pulse trains are being changed-over in succession. When no error is detected, the change-over is ended. In addition, the change-over operation is dispensed with in a case where (N−1) decision circuits are respectively operated by the (N−1) trains of clock pulses and where the clock pulse train correctly discriminated is selected. Further, the baud clock pulses may well be caused to rise, in such a way that the decision circuit and the discriminator are operated by the (N−1) times clock pulses and that the phase of the clock pulses correctly discriminated is regarded as the correct clock pulse phase.

BRIEF DESCRIPTION OF THE DRAWINGS

Further objects, features and advantages of the present invention will become more clear from the following detailed description of a preferred embodiment, shown in the drawing, wherein:

FIG. 11 is a signal timing chart for explaining the operation of the circuit in FIG. 10.

FIG. 13 is a block diagram showing the fourth embodiment of the distinguishing circuit of the present invention.

DETAILED DESCRIPTION OF THE PREFERRED EMBODIMENT

Now, embodiments of the present invention will be described with reference to the drawings wherein like numerals identify like parts.

Figure 1:
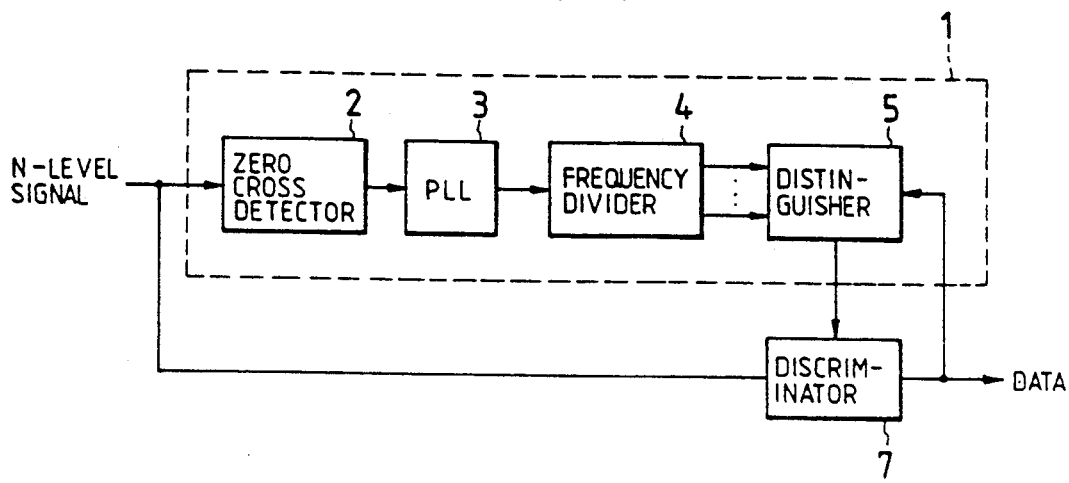
FIG. 1 is a system block diagram showing an embodiment of the present invention.

FIG. 1 is a schematic diagram showing an embodiment of the timing extraction unit of the present invention. The timing extraction unit 1 is constructed of a zero cross detector 2, a PLL 3, a frequency divider 4 and a distinguisher 5. Symbol 7 denotes a discriminator. (N−1) sorts of zero cross timings are detected from an N-level signal by the zero cross detector 2. The PLL 3 generates clock pulses whose frequency is (N−1) times higher than a baud, and which are synchronized with all zero cross points. The frequency divider 4 produces (N−1) trains of baud clock pulses in phases different from one another, from the clock pulses having the (N−1) times frequency. The distinguisher 5 selects one of the baud clock pulse trains, using the output data of the discriminator 7.

Figure 2:
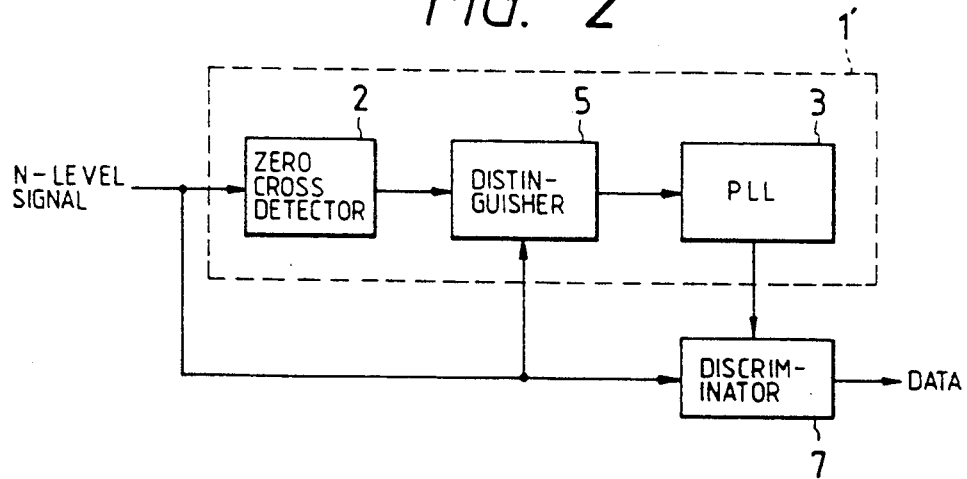
FIG. 2 is a system block diagram showing another embodiment.

FIG. 2 is a schematic diagram showing another embodiment of the timing extraction unit of the present invention. The timing extraction unit 1 is constructed of a zero cross detector 2, a distinguisher 5 and a PLL 3. Symbol 7 denotes a discriminator. The zero cross detector 2 detects (N−1) sorts of zero cross timings from an N-level code. Using the N-level signal, the distinguisher 5 distinguishes only one sort of zero cross timings which appear with a baud period as a unit, from among (N−1) sorts of zero cross timings. The distinction can also be done using the output data of the discriminator 7. The PLL 3 delivers baud clock pulses in synchronism with the zero cross timings which are the output of the distinguisher 5.

Figure 21:
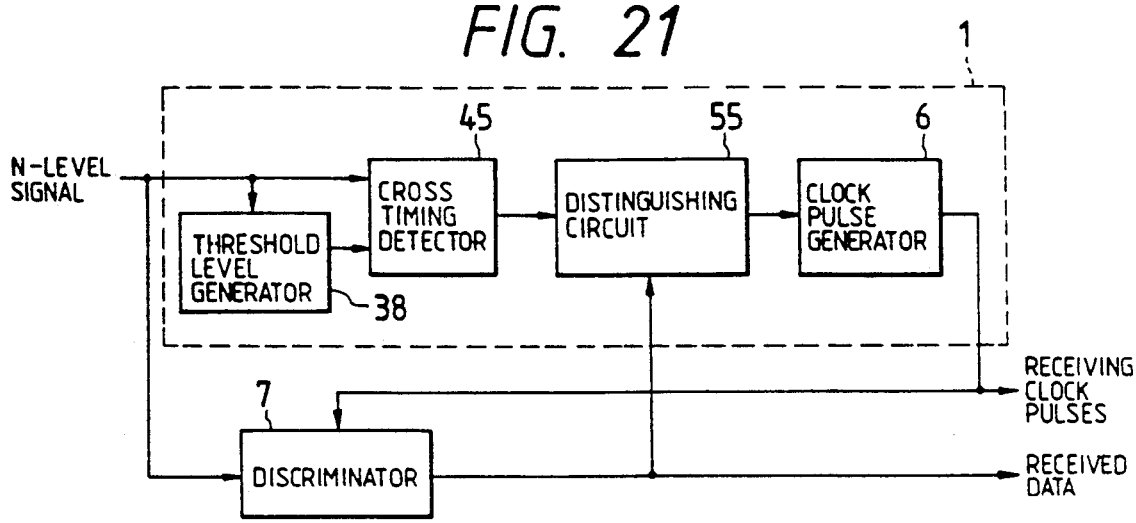
FIG. 21 shows a modification of the embodiment in FIG. 1.
Figure 22:
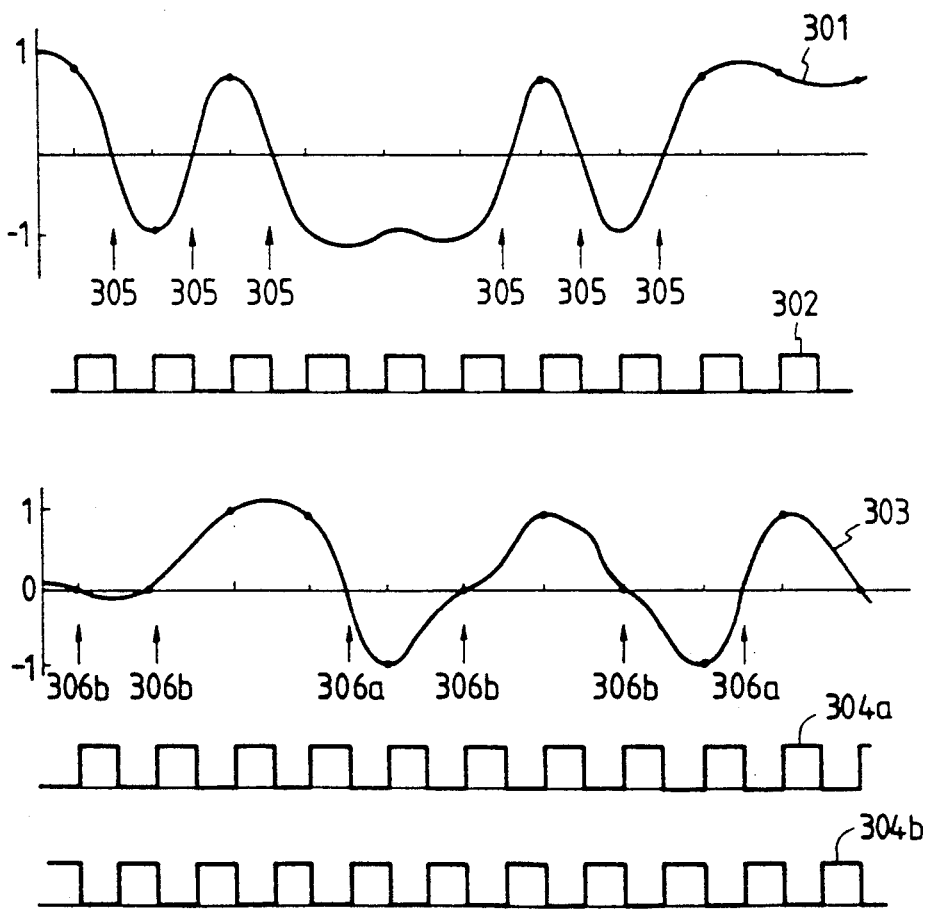
FIG. 22 is a timing chart for explaining the principle of the present invention.

FIG. 21 shows a modification of the embodiment illustrated in FIG. 1. The timing extraction unit 1 is constructed of threshold level generator 38, a cross timing detector 45, a distinguishing circuit 55 and a clock pulse generator 6. Symbol 7 denotes a discriminator. The threshold level generator 38 supplies the cross timing detector 45 with a threshold voltage so as to detect timings at which a received signal and the threshold level cross. Incidentally, in case of employing a balanced code which oscillates positively and negatively with respect to 0 volt, it is most effective to set the threshold voltage at 0 volt. In this way, (N−1) sorts of cross timings can be detected for the N-level signal, and only the cross timings of one sort can be extracted by the distinguisher 55. The distinction is performed using the output of the discriminator 7. The clock pulse generator 6 generates baud clock pulses synchronized with one sort of cross timings mentioned above.

Figure 23:
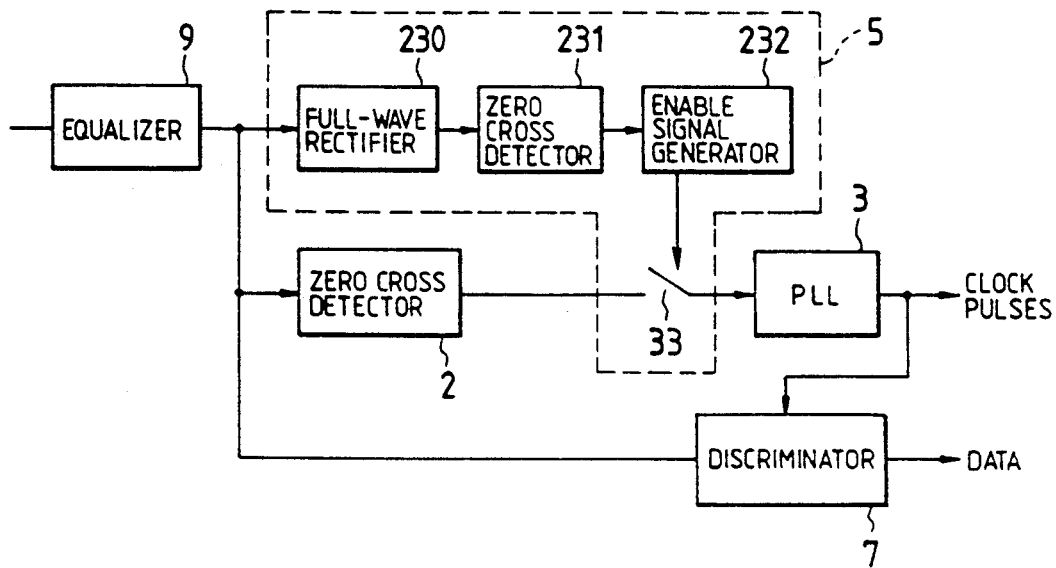
FIG. 23 is a diagram showing an embodiment of a distinguishing circuit in the embodiment of FIG. 2.

FIG. 23 shows an embodiment of the distinguisher 5 illustrated in FIG. 2. The distinguisher 5 is configured of a full-wave rectifier 230, a zero cross detector 231, enable signal generator 232 and a switch 33. A signal rectified by the full-wave rectifier 230 contains no zero cross point coincident with a zero cross point, and zero cross points concentrate near the middle of adjacent discriminative points. The zero cross points are detected by the zero cross detector 231, and an enable signal is generated by triggering the zero cross timing first taken. This processing is executed by the enable signal generator 232. In order to prevent unnecessary zero cross points from being detected, the width of the enable signal should desirably be made sufficiently smaller than that of a time slot. The switch 33 is turned "on" and "off" by the enable signal, and only the zero cross points each lying just at the middle of the adjacent discriminative points are distinguished. The PLL 3 generates the baud clock pulses in synchronism with these zero cross points. The trailing edges of the clock pulses are just coincident with the discriminative points. The equalizer compensates for attenuation in the lines.

Figure 24:
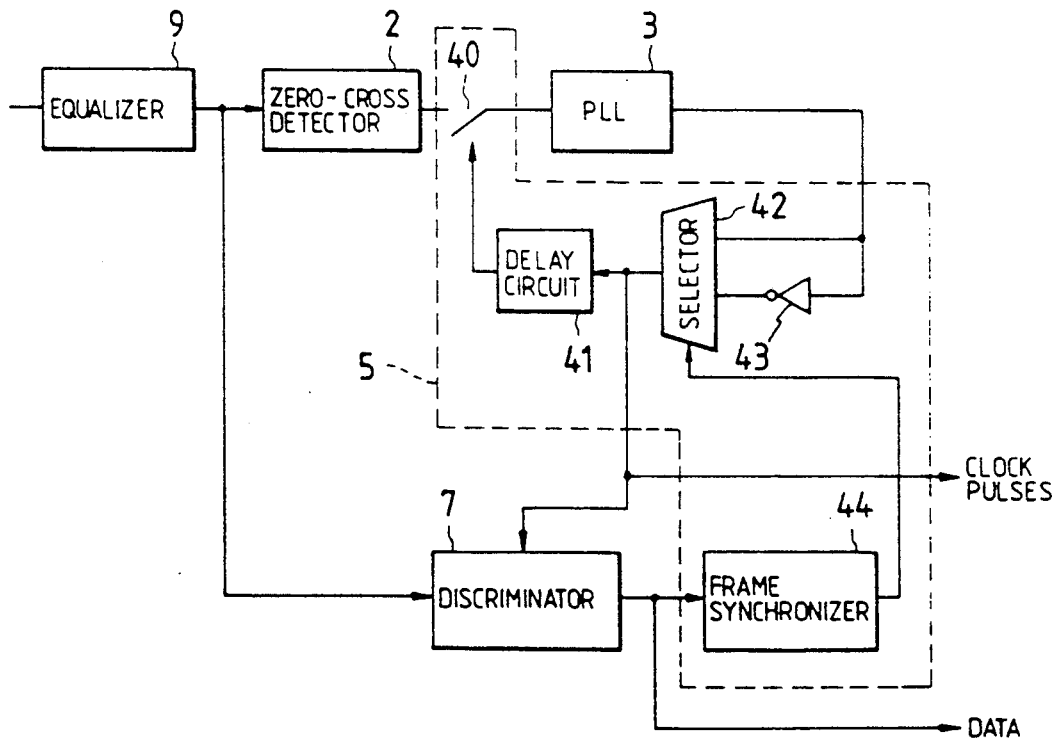
FIG. 24 is a diagram showing another embodiment of the distinguishing circuit in the embodiment of FIG. 2.

FIG. 24 shows another embodiment of the distinguisher 5 illustrated in FIG. 2. The distinguisher 5 is configured of a switch 40, a delay circuit 41, a selector 42, an inverter 43 and a frame synchronization circuit 44. The circuit 44 and selector 42 are described in detail later with reference to FIG. 8 and its modifications. The switch 40 is the switch which serves to distinguish the zero cross timings at the baud. The control of the switch 40 is performed in the following procedure: The PLL 3 generates the baud clock pulses, the leading edges or trailing edges of which are synchronous to discriminative points. Using the inverter 43, two trains of baud clock pulses in phases opposite to each other are generated. The selector 42 selects either train of baud clock pulses by the use of the discriminator 7 and the frame synchronization circuit 44. These clock pulses are appropriately delayed by the delay circuit 41 to control the switch 40. Thus, only the zero cross timings which do not coincide with the discriminative points can be removed. Besides, in the control of the selector 42, a code-side violation detector or a training pattern checker can be applied instead of the frame synchronization circuit 44.

Figure 3:
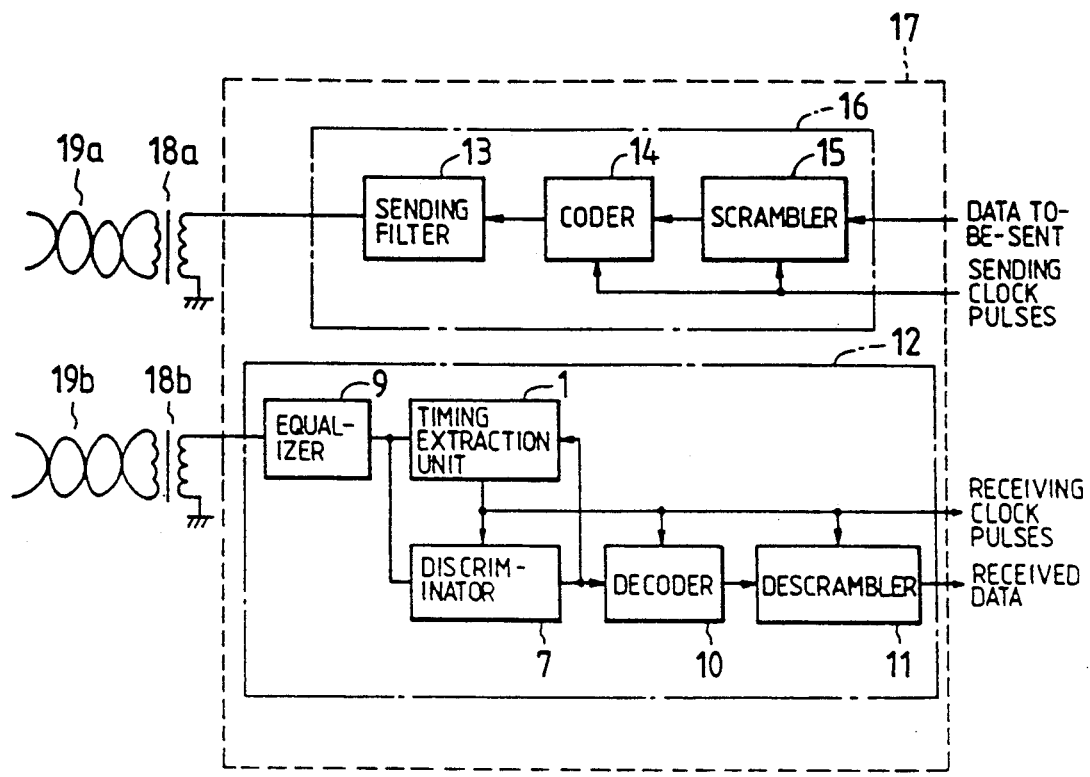
FIG. 3 is a block diagram showing an embodiment of a transmission circuit LSI to which the present invention is applied.

FIG. 3 shows an embodiment in the case where the timing extraction unit 1 is built in an LSI 17. A sending circuit 16 is constructed of a sending filter 13, a coder 14 and a scrambler 15. Data to-be-sent is turned by the scrambler 15 into scrambled binary data, which the coder 14 turns into a transmission code, which is output through the sending filter 13. The scrambler 15 is required in order to prevent a specified pattern difficult of timing extraction from being successively sent. On this occasion, the coder 14 and the scrambler 15 operate in accordance with sending clock pulses. A signal to-be-sent is sent through a sending transformer 18a as well as telephone wire 19a.

On the other hand a receiving circuit 12 is constructed of the timing extraction unit 1, the discriminator 7, an equalizer 9, a decoder 10 and a descrambler 11. A signal received through telephone wire 19b as well as a receiving transformer 18b is compensated by the equalizer 9, and is converted into digital data by the discriminator 7. Thereafter, the digital data is converted into binary data by the decoder 10. Further, the scramble applied by the scrambler 15 is released by the descrambler 11. The timing extraction circuit 1 generates receiving clock pulses for the decoding operation of the discriminator 7, decoder 10 and descrambler 11. The sending circuit 16 and the receiving circuit 12 can be formed as the transmission circuit LSI on a single semiconductor substrate.

Figure 4:
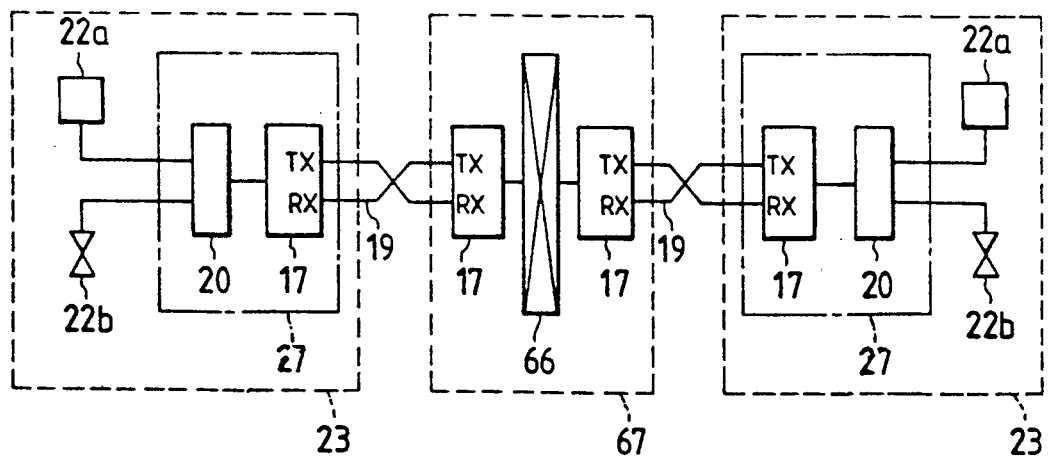
FIG. 4 is a block diagram showing an embodiment of a communication system to which the present invention is applied.

FIG. 4 shows an embodiment of a communication system to which the transmission circuit LSI 17 is applied. A protocol processing unit (PPU) 20 which executes various items of processing required for communication together with the transmission circuit LSI 17 constitutes a communication interface 21. The communication interface 21 send and receive signals among data terminals (DT) 22a and telephone sets 22b. Each terminal station 23 is configured of the data terminal 22a, telephone set 22b and communication interface 21. Each terminal station communicates with an exchanger 67, which is internally furnished with the transmission circuit LSIs 17, which send and receive signals between them and an exchange circuit 66.

Next, the arrangement of the timing extraction unit 1 in the embodiment illustrated in FIG. 1 will be concretely described. The first embodiment will be described with reference to FIGS. 5 and 6.

Figure 5:
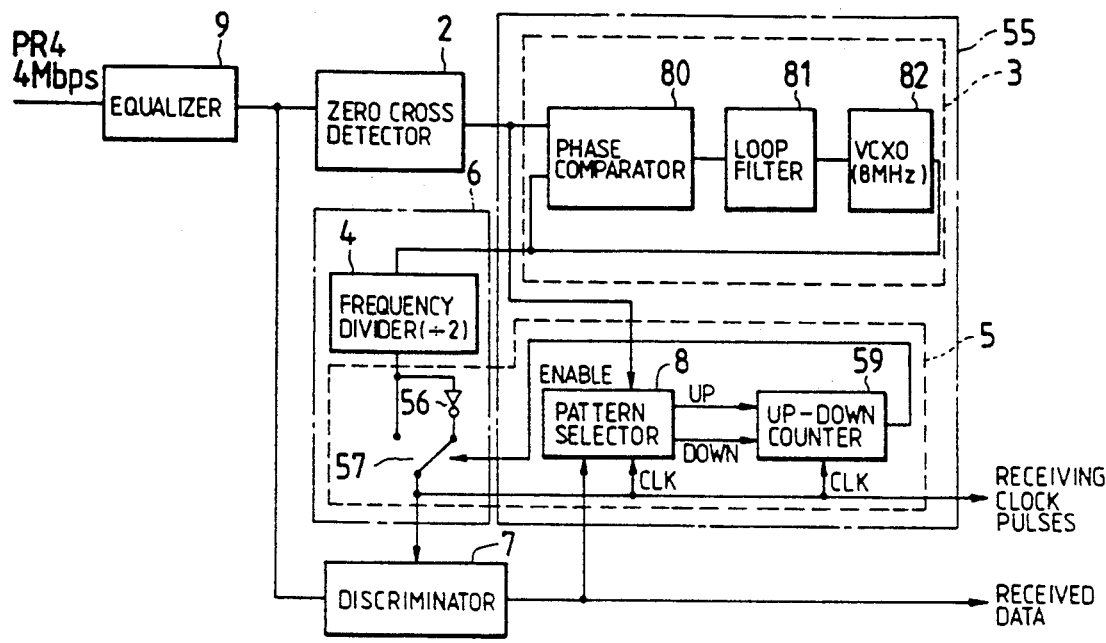
FIG. 5 is a block diagram showing the first embodiment of the distinguishing circuit of the present invention.

FIG. 5 is a block diagram showing one embodiment of the receiving circuit in the case where the PR4 code of 4 Mbps is applied. This receiving circuit is constructed of an equalizer 9, a zero cross detector 2, a distinguishing circuit 55, a clock pulse generator 6 and a discriminator 7. The distinguishing circuit 55 is configured of a PLL 3, a pattern selector 8 and an up-down counter 59. Further, the PLL 3 is constituted by a phase comparator 80, a loop filter 81 and a VCXO 82 having a center frequency of 8 MHz, and the clock pulse generator 6 is constituted by a frequency divider 4, a NOT gate 56 and a switch 57.

Figure 6:
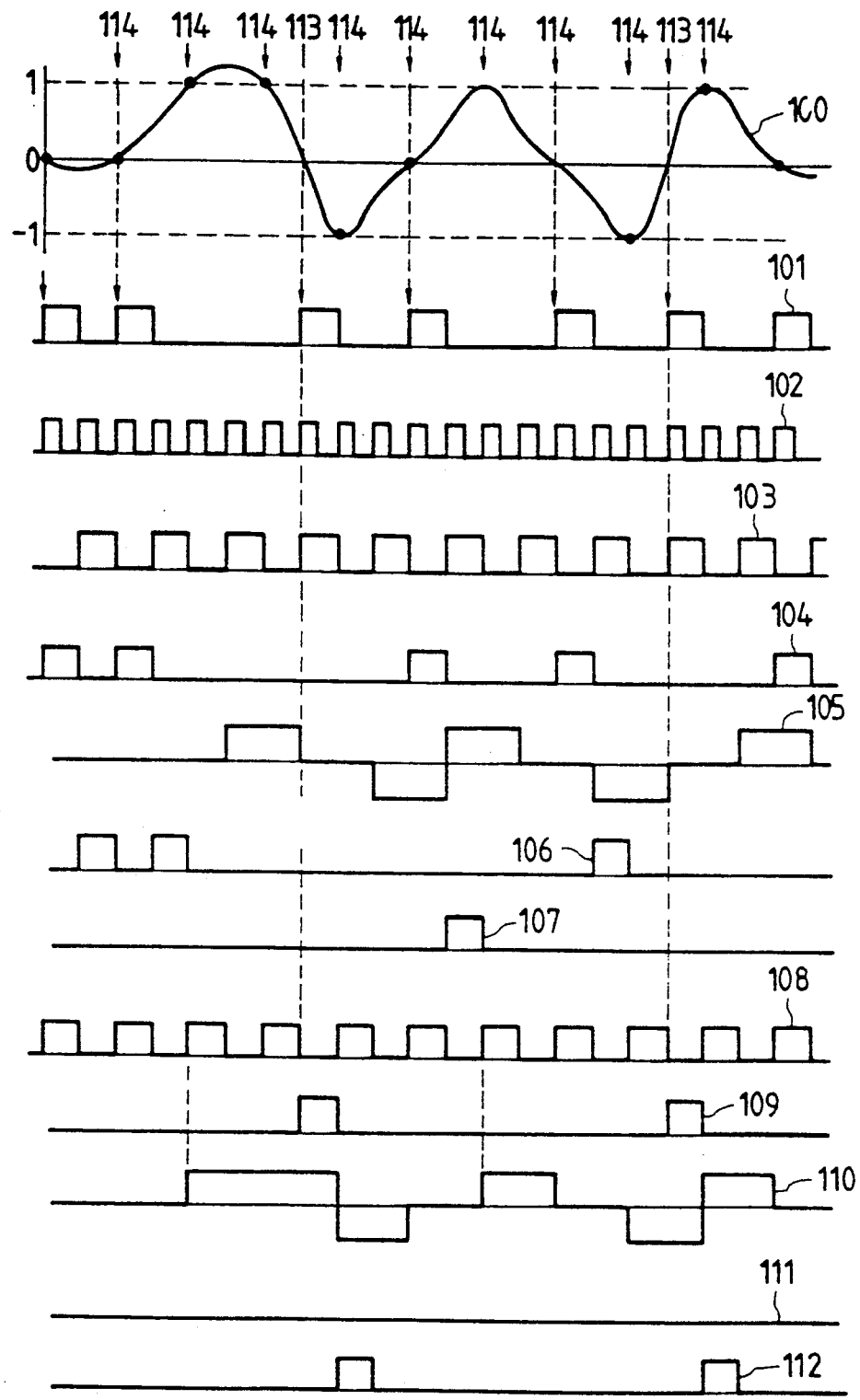
FIG. 6 is a timing chart for explaining the operation of the circuit in FIG. 5.

FIG. 6 is a timing chart which illustrates the operation of this embodiment. Numeral 100 designates the output wave form of the equalizer 9, numeral 101 the output of the zero cross detector 2, numeral 102 output clock pulses of 8 MHz produced from the VCXO 82, numeral 103 clock pulses of 4 MHz obtained by dividing the frequency of the clock pulses 102, numeral 104 a pattern check signal obtained with the AND combination of the inversion of the clock pulses 103 and waveform 101, numeral 105 shows values discriminated with the clock pulses 103, numeral 106 is an error signal produced when the clock pulses 103 are used, and numeral 107 a non-error signal produced when the clock pulses 103 are used. In addition, numeral 108 designates clock pulses of 4 MHz which are obtained by dividing the frequency of the clock pulses 102 and which have a phase opposite to that of the clock pulses 103. Numeral 109 indicates a pattern check signal obtained with the clock pulses 108, numeral 110 shows values discriminated with the clock pulses 108, numeral 111 is an error signal produced when the clock pulses 108 are used, and numeral 112 a non-error signal produced when the clock pulses 108 are used. Numeral 113 indicates a timing, and numeral 114 the timing of a discriminative point.

The output waveform 100 of the equalizer 9 is applied to the zero cross detector 2, whereby the zero cross timings 101 are extracted. Where the zero cross detector 2 is provided with a hysteresis of several hundred mV, the erroneous detection of the zero cross timing ascribable to noise can be prevented when a level "0" had been received in close succession. Thereafter, the zero cross timings 101 are applied to the VCXO 82 via the phase comparator 80 as well as the loop filter 81. With the PR4 code which is a three-level (N-level) code, $(N-1)3-1=2$ zero cross points are obtained per time slot. Therefore, the VCXO is designed with a frequency center at $4 MHz \times 2 = 8$ MHz, that is $(N-1)$ times the baud. Thus, even when the zero cross timings 101 are not periodical, the clock pulses of stable frequency 102 can be output.

The output clock pulses 102 delivered from the PLL 3 are converted into the baud clock pulses of 4 MHz 103 by the frequency divider 4. The clock pulses of the opposite phase 108 are generated by the NOT gate 56. Therefore clock pulses 103 and 108 are the $(N-1)$ number of baud clocks of different phase with $N=3$ for three level coding. The switch 57 applies a selected one of the above clock pulses 103 and 108 to the discriminator 7. The selection is effected by the functions of the pattern selector 8 and the up-down counter 59.

Figure 7:
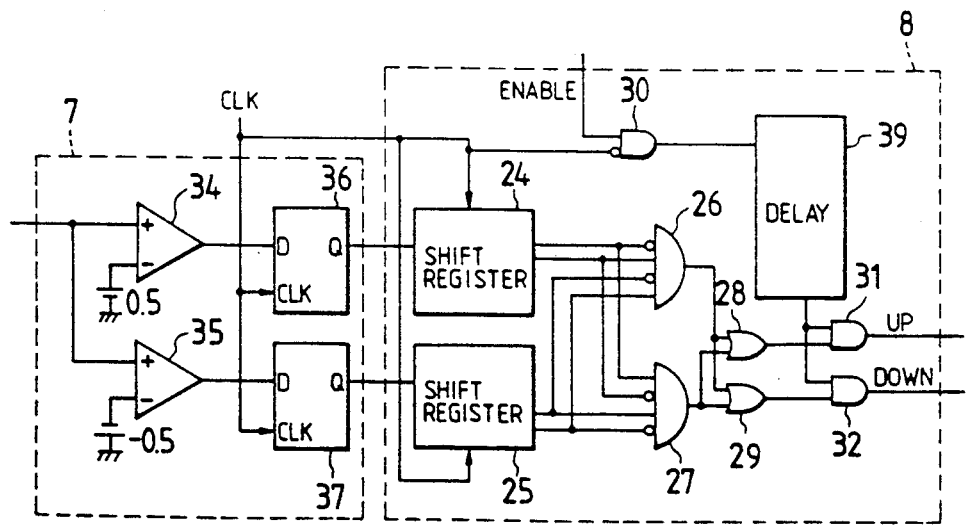
FIG. 7 is a circuit diagram showing the details of major portions in FIG. 5.

In particular, the operation of the pattern selector will be described with reference to FIG. 7. The discriminator 7 is configured of comparators 34, 35 and latches 36, 37. In addition, the pattern selector 8 is configured of shift registers 24, 25 and gates 26–32. When note is taken of the features of the waveform 100 of the PR4 code, the gradient of the signal is great and a timing jitter ascribable to noise is small at the zero cross timing 113 in the course of transition from "1" to "−1" (or from "−1" to "1"). The timing 113 lies at the middle point of the correct discriminative points 114. The trailing edge of the clock pulse 108 coincides with the zero cross timing 113, while the leading edge of the clock pulse 108 coincides with the correct discriminative point 114.

In this embodiment, the clock pulses 108 are produced from the clock pulses 102, and the received waveform is discriminated with the leading edges of the clock pulses 108. Here, assuming first a case where the switch 57 shown in FIG. 5 selects the erroneous clock pulses 103, the data items 105 discriminated by the comparators 34, 35 and the latches 36, 37 are output. Further, the outputs are passed via the 2-bit shift registers 24, 25, and patterns "1, −1" and "−1, 1" are selected by the gates 26, 27, 28, 29. When the pattern has been obtained, the output of the gate 29 becomes a high level, and when not, the output of the gate 28 becomes the high level. When the leading edge of the zero cross signal 101 and the trailing edge of the clock pulse 103 are coincident, the pattern check signal 104 is obtained as the output of the gate 30. The pattern check signal is input to the gates 31 and 32. This operation corresponds to deciding if the discriminative values before and behind the timing 113 are "1, −1" or "−1, 1". In the case where the pattern has been obtained, the non-error signal 107 is output from the gate 32, and the content of the up-down counter 59 in FIG. 5 is decremented by 1. In contrast, in the case where the pattern has not been obtained, the error signal 106 is output from the gate 31, and the content of the up-down counter 59 is incremented by 1. During the period of time during which the discriminator 7 and the pattern selector 8 operate in accordance with the clock pulses 103, the number of the pulses of the error signal 106 is larger than that of the pulses of the non-error signal 107, and the content of the up-down counter 59 increases on and on. When the content exceeds a predetermined value, a change-over signal is delivered from the up-down counter 59, and the switch 57 is changed-over. Thus, the discriminator 7 and the pattern selector 8 come to operate in accordance with the correct clock pulses 108. On this occasion, the error signal 111 is not output, and only the non-error signal 112 is output. Accordingly, the content of the up-down counter 59 is stabilized at "0", and the switch 57 is kept intact, whereby the correct discrimination is effected.

In the above embodiment, when the pattern "1, −1" or "−1, 1" is detected, the 4 MHz-clock pulse train selected at that time is regarded as being correct. To the contrary, in a case where any of, for example, the four sorts of PR-4 code violation patterns of "1, 1, 1", "−1, −1, −1", "1, −1, 1", "−1, 1, −1" is detected, the baud clock pulse train selected at that time may well be judged erroneous.

Now the second embodiment of the distinguisher 7 will be described with reference to FIG. 8. The distinguisher 7 is configured of a selector 50 and a frame synchronization circuit 51. The zero cross detector 2 delivers all of the (N−1) sorts of zero cross timings from within the output N-level signal of the equalizer 9. The PLL 3 generates the clock pulses at a frequency being (N−1) times higher than the baud, in synchronism with all the zero cross timings. In the case of applying the PR4 transmission code of three levels, that is when N=3, when $f_b$ is the baud, the frequency of the output clock pulses of the PLL 3 is 2 $f_b$. The frequency divider 4 generates two trains of baud clock pulses whose phases are opposite to each other. The selector 50 distinguishes the correct one of the trains of baud clock pulses under the control of the output of the frame synchronization circuit 51. The frame synchronization circuit 51 operates according to the baud clock pulses selected by the selector 50. Therefore, if the selected baud clock pulses are synchronous to discriminative points, a correct frame synchronization pattern is detected, and the frame synchronization is properly done. In contrast, if the selected baud clock pulses shift from the discriminative points, the frame synchronization pattern is not correctly discriminated, and the frame synchronization is not established. Unless the frame synchronization is established for a fixed time interval, the selector 50 selects the clock pulse train the phase of which is opposite to that of the baud clock pulse train currently selected. Since the clock pulse train selected has the clock pulses synchronous to the discriminative points, the frame synchronization is established, and the selector becomes stable. However, if the last frame synchronization pattern of the discriminator 7 is one in which the same values succeed each other, for example, "−1, −1, −1, −1, −1, −1, −1, −1", a correct discrimination can be performed even with clock pulses which shift from the discriminative points. In order to prevent this drawback, the frame synchronization pattern should desirably contain a pattern in which the same values do not succeed each other. Especially in the case where the PR4 code is applied as the transmission code, a pattern containing "1, −1" or "−1, 1" may be employed as the frame synchronization pattern. On this occasion, "1, −1" or "−1, 1" is correctly recognized as the clock pulses which coincide with the discriminative points, whereas "0" lying midway of the change of "1, −1" or "−1, 1"" is discriminated with the clock pulses in the opposite phase. This is convenient for the decision because "0" which does not appear in the discrimination with the correct clock pulse train appears as the discriminated value infallibly with the opposite-phase clock pulse train.

Figure 8:
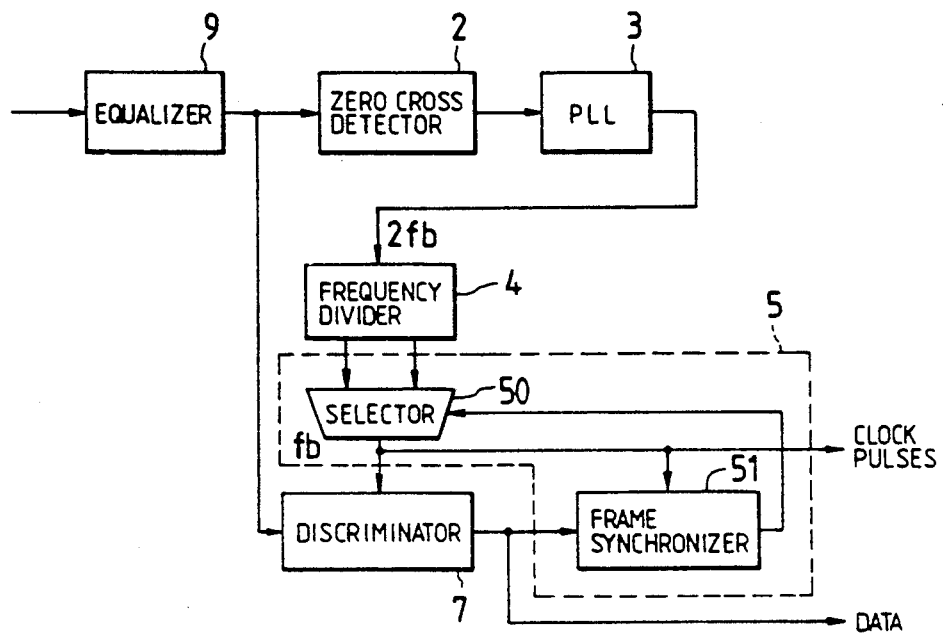
FIG. 8 is a block diagram showing the second embodiment of the distinguishing circuit of the present invention.
Figure 9:
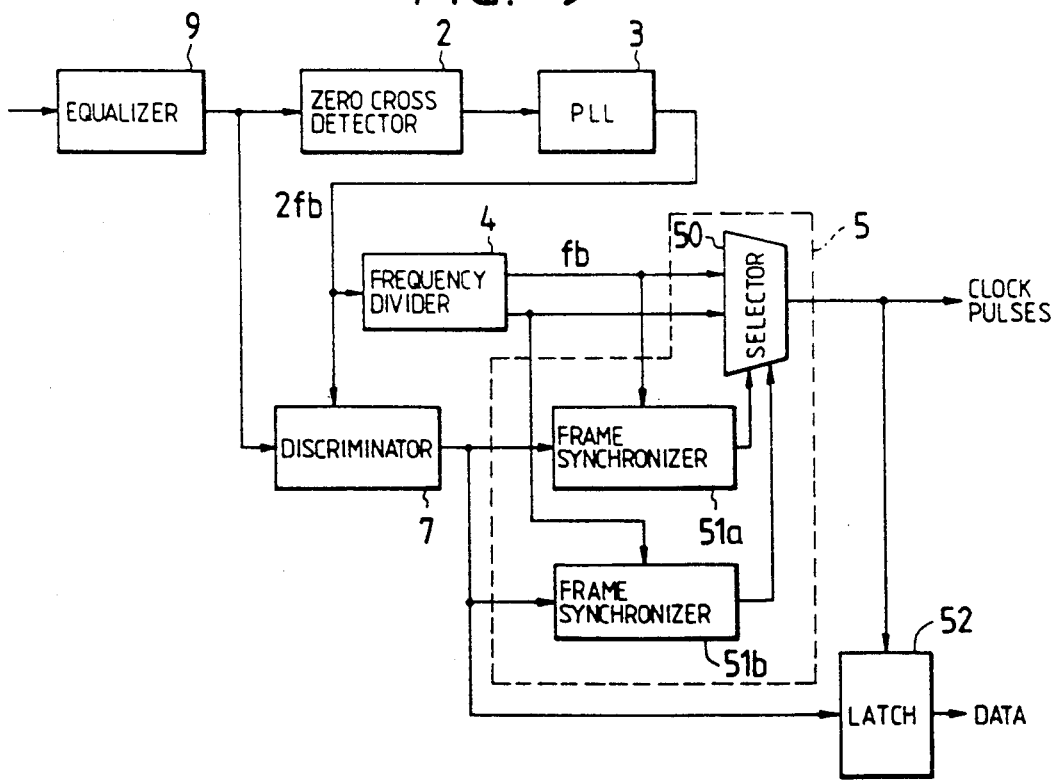
FIG. 9 shows a modification of the embodiment in FIG. 8.

FIG. 9 shows a modification of the embodiment illustrated in FIG. 8. The distinguisher 5 is configured of a selector 50 and two frame synchronization circuits 51a, b. The frame synchronization circuits 51a, b operate according to the clock pulse trains of the phases opposite to each other, generated by the frequency divider 4. The clock pulse train with which the frame synchronization has been established, may be selected by the selector 50. In addition, a latch 52 serves to pass data with the correct clock pulses. Although this embodiment increases the amount of hardware, it has the advantage that the baud clock pulse trains need not be changed-over every fixed time interval.

Figure 25:
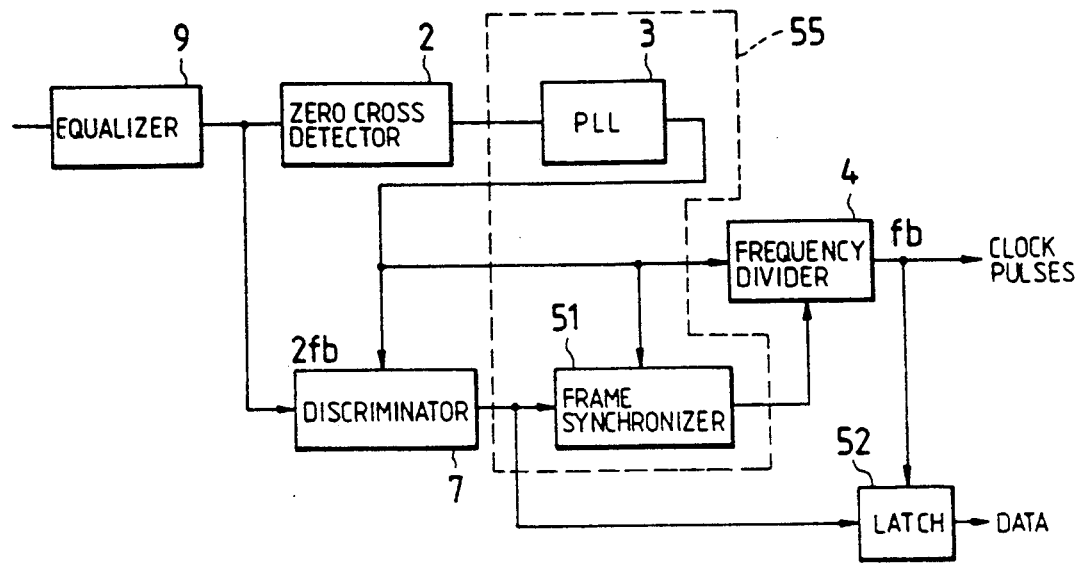
FIG. 25 shows another modification of the embodiment in FIG. 8.

FIG. 25 shows another modification of the embodiment illustrated in FIG. 8. The distinguishing circuit 55 is configured of a frequency divider 4 and a frame synchronization circuit 51. The frame synchronization circuit 51 and the discriminator 7 operate at a frequency 2 $f_b$ which is twice as high as the baud. The frame synchronization circuit stores the output data of the discriminator 7 every second time slot, and checks the frame synchronization pattern. The moment the frame synchronization has been established, the frequency divider 4 is reset, and the phase of the output baud clock pulses is established. In this modification, the discriminator 7 is operated with the clock pulses at the frequency twice the baud, so that a problem in a circuit operation is sometimes caused in high-speed transmission. In this case, two discriminators may be respectively operated with the baud clock pulse trains of opposite phases, and the outputs of which have their OR logic taken, to reduce the in circuit frequency.

In the foregoing embodiments, a code-side violation detector or a training pulse checker is also applicable instead of the frame synchronization circuit 51.

Figure 10:
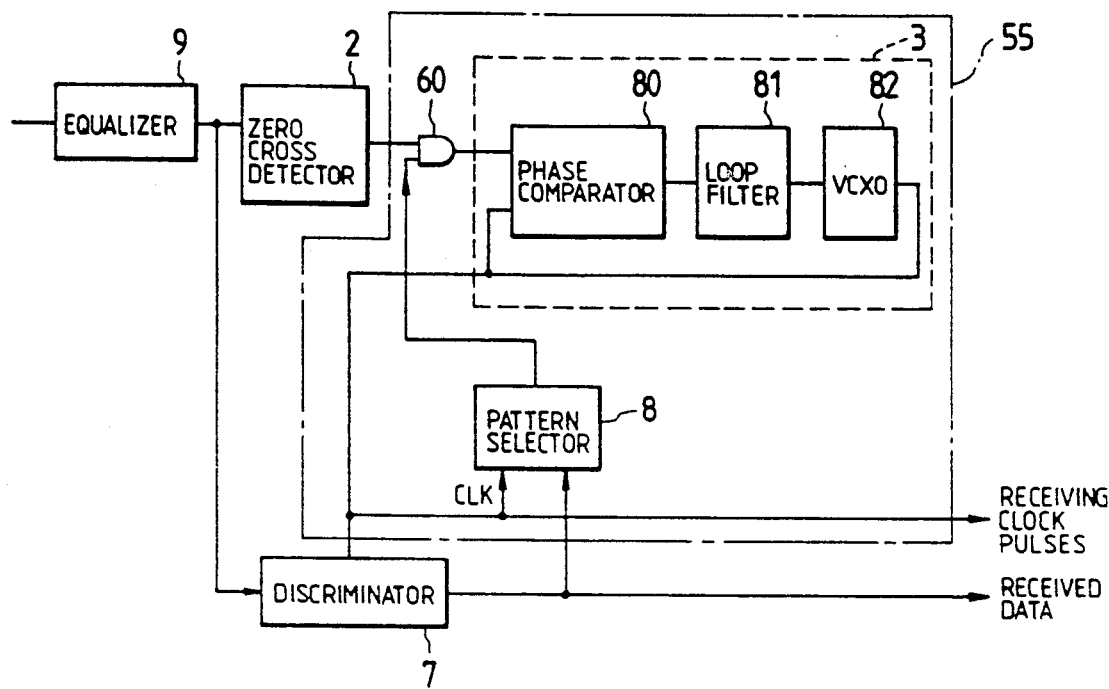
FIG. 10 is a block diagram showing the third embodiment of the distinguishing circuit of the present invention.

Now, the third embodiment of the distinguisher of the present invention will be described. Although this embodiment is also an example applied to the PR4 code of 4 Mbps, the PLL delivers output clock pulses of 4 MHz, not of 8 MHz. FIG. 10 shows a block diagram of this embodiment. This circuit is constructed of an equalizer 9, a zero cross detector 2, a distinguishing circuit 55 and a discriminator 7. The distinguishing circuit 55 is configured of the PLL 3, a pattern selector 8 and a gate 60. In addition, the PLL 3 is constituted by a phase comparator 80, a loop filter 81 and a VCXO 82.

FIG. 11 is a timing chart showing the operation of the FIG. 10 embodiment, in which numeral 100 designates an equalized waveform, numeral 101 a zero cross timing, numeral 113 a timing, numeral 114 the timing of a discriminative point, numeral 120 the initial phase of clock pulses, numeral 121 a value discriminated with the clock pulses 120, numeral 122 an enable signal produced from signals 120 and 121, numeral 123 timing information that is sent to the PLL 3, and numeral 124 the convergent value of the clock pulses.

Figure 12:
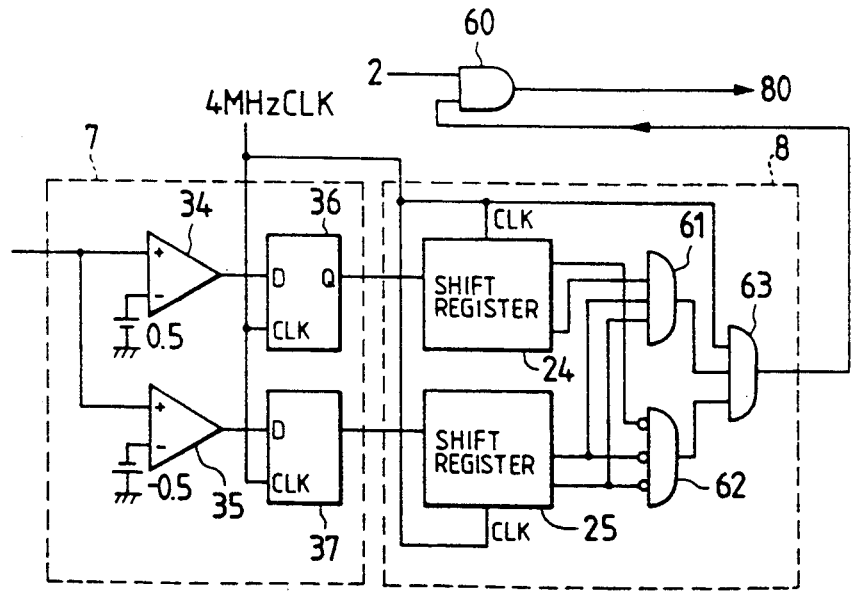
FIG. 12 is a circuit diagram showing the details of major portions in the circuit in FIG. 10.

FIG. 12 shows the arrangements of the pattern selector 8 and the peripheral circuits. The discriminator 7 is configured of comparators 34, 35 and latches 36, 37. The pattern selector 8 is configured of 2 bit-shift registers 24, 25 and gates 61, 62, 63. The output of the gate 63 is delivered to the gate 60.

The output waveform 100 of the equalizer 9 is applied to the zero cross detector 2, from which the zero cross timing 101 is delivered. On this occasion, if the initial clock phase of the VCXO 82 is as illustrated at 120, the zero cross timing 101 and the clock pulse 120 are compared by the phase comparator 80 so that the leading edge of the timing pulse 101 and the trailing edge of the clock pulse 120 may coincide. Here, assuming that all the pulses of the zero cross timings 101 are sent to the phase comparator 80, the trailing edge of each clock pulse 120 functions to simultaneously coincide with both the timing 113 and the timing 114, resulting in an unstable phase.

In this embodiment, therefore, only the pulses which rise at the timings 113 are sent to the phase comparator 80. This operation is effected by the cooperation of the discriminator 7, pattern selector 8 and gate 60, as stated below: First, the discriminator 7 delivers the discriminated values 121 in synchronism with the initial clock pulses 120. In a case where the discriminated values agree with any of the four sorts of patterns; "−1, 1'''", "0, 1", "0, −1" and "−1, −1", the enable signal 122 of half time slot=125 ns is produced. This operation is performed by the shift registers 24, 25 and the gates 61, 62, 63. The AND signal 123 between the zero cross timing 101 and the enable signal 122 is output from the gate 60. The signal 123 is input to the phase comparator 80, which operates so that the leading edge of the signal 123 and the trailing edge of the clock pulse 120 may coincide. Finally, the output of the VCXO becomes as shown at numeral 124 and stable, and the leading edges of the clock pulses 124 coincide with the correct discriminative points.

Now, the fourth embodiment of the distinguisher of the present invention will be described. This embodiment is a method in which, among the zero cross timings of a received waveform, only the timings of great waveform gradients are input to the PLL.

FIG. 13 is a block diagram of this embodiment. The embodiment is constructed of an equalizer 9, a zero cross detector 2, a distinguishing circuit 55 and a discriminator 7. The distinguishing circuit 55 is configured of the PLL 3, a differentiator 70 gates 60, 73, and comparators 71, 72. Further, the PLL 3 is constituted by a phase comparator 80, a loop filter 81 and a VCXO 82.

Figure 14:
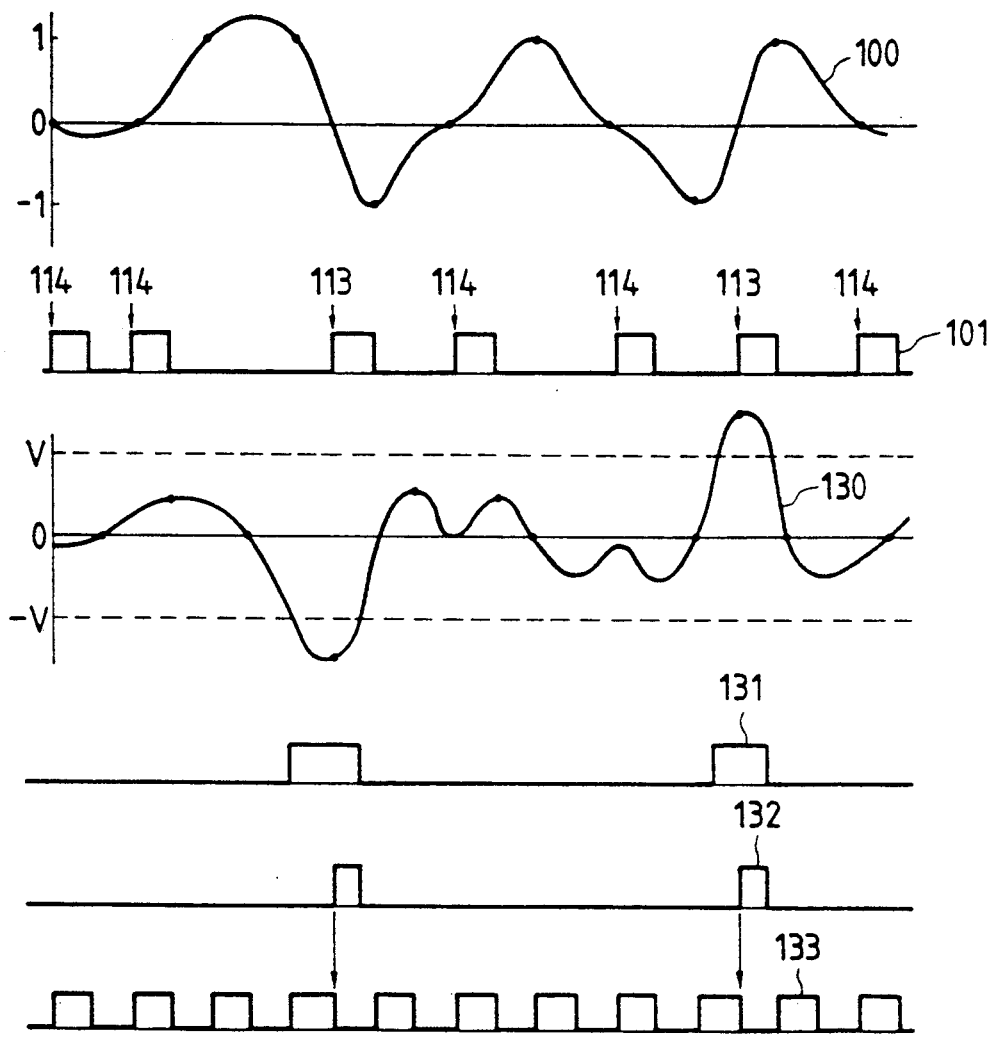
FIG. 14 is a signal timing chart for explaining the operation of the circuit in FIG. 13.

FIG. 14 is a timing chart showing the operation of the FIG. 13 embodiment. Numeral 100 designates an equalized waveform, numeral 101 a zero cross timing, numeral 113 a timing, numeral 130 the differentiated waveform of the waveform 100, numeral 131 an enable signal, numeral 132 timing information, and numeral 133 output clock pulses.

In this embodiment, among the zero cross timings 101 extracted from the equalized waveform 100, only the pulses with leading edges coincident with the timings 113 are sent to the phase comparator 80. To this end, the differential waveform 130 of the equalized waveform 100 is generated by the differentiator 70, and sections in which the differentiated waveform 130 becomes above a threshold level V or below a threshold level-V are detected as the enable signal 131 by the comparators 71, 72 and the gate 73. The logical sum between the enable signal 131 and the zero cross timing 101 is taken by the gate 60, the output signal 132 of which is input to the phase comparator 80. The clock pulses 133 which are finally output from the VCXO, have their trailing edges synchronized with the leading edges of the timing information 132. Accordingly, the leading edges of the clock pulses 133 coincide with the correct discriminative points 114.

Now, the fifth embodiment of the distinguisher of the present invention will be described with reference to FIGS. 15–17. This embodiment is applied to the 2BIQ code of 4 Mbps. Since, in this case, the baud is 2 Mbps, one time slot becomes 500 ns, and the number of zero cross phase points becomes 4-1=3. The PLL is operated at 6 MHz being 3 times the baud, and is synchronized with the zero crosses of an equalized waveform.

Figure 15:
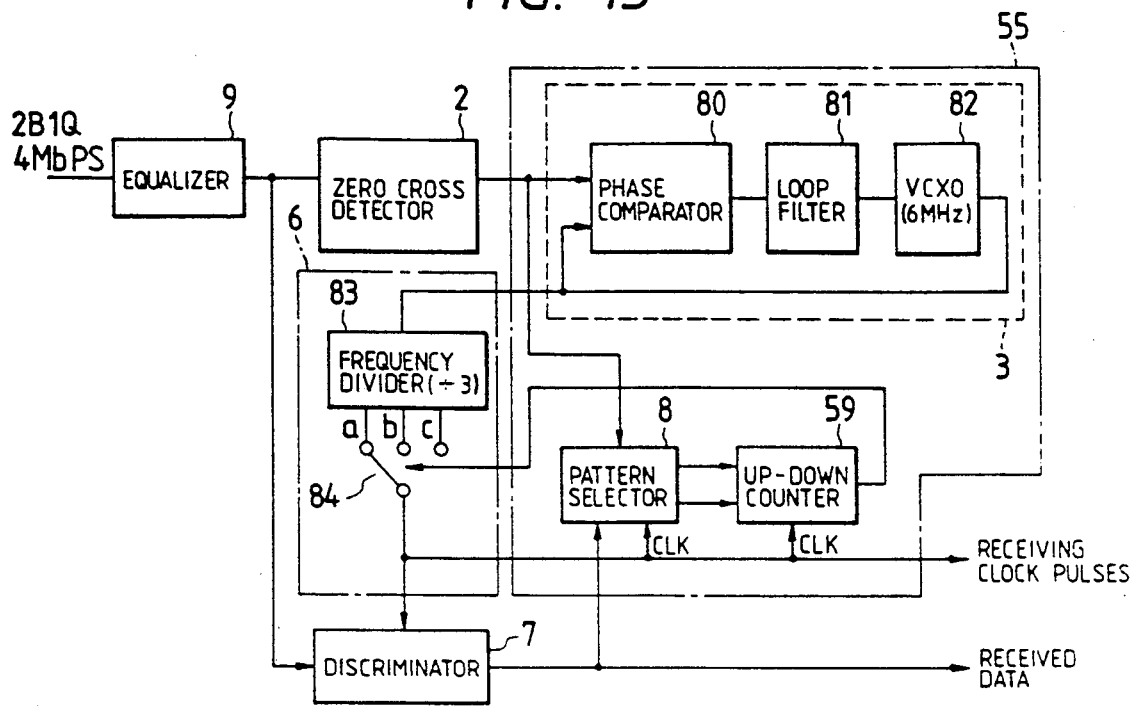
FIG. 15 is a block diagram showing the fifth embodiment of the distinguishing circuit of the present invention.

FIG. 15 is a block diagram showing the whole arrangement of this embodiment, which is constructed of an equalizer 9, a zero cross detector 2, a distinguishing circuit 55, a clock pulse generator 6 and a discriminator 7. The distinguishing circuit 55 is configured of the PLL 3, a pattern selector 8 and an up-down counter 59. Besides, the clock pulse generator 6 is configured of a divide-by-3 frequency divider 83 and a switch 84. The PLL 3 is constituted by a phase comparator 80, a loop filter 81 and a VCXO 82.

Figure 16:
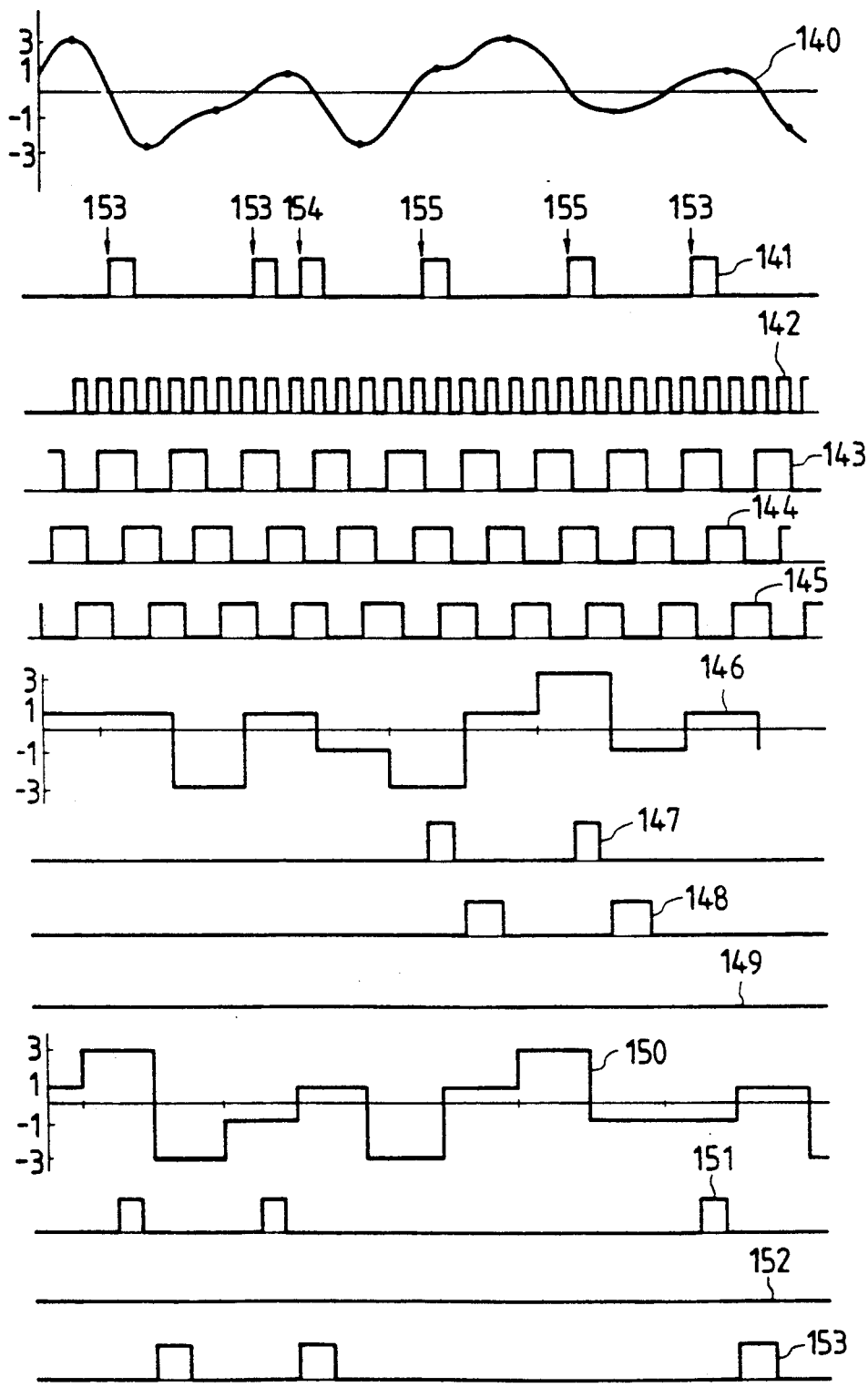
FIG. 16 is a signal timing chart for explaining the operation of the circuit in FIG. 15.

FIG. 16 is a timing chart showing the operation of the embodiment, in which numeral 140 designates an equalized waveform, numeral 141 a zero cross timing, numeral 142 clock pulses of 6 MHz, and numerals 142, 143 and 144 clock pulse trains of 2 MHz in respectively different phases, all of these clock pulse trains being generated in such a way that the frequency of the clock pulses 142 is divided by 3. Numeral 146 indicates values discriminated with the clock pulses 143, numeral 147 an enable signal in the case of the clock pulses 143, numeral 148 an error signal, and numeral 149 a non-error signal. In addition, numeral 150 indicates values discriminated with the clock pulses 145, numeral 151 an enable signal, numeral 152 an error signal, numeral 153 a non-error signal, and numerals 153, 154 and 155 timings.

Figure 17:
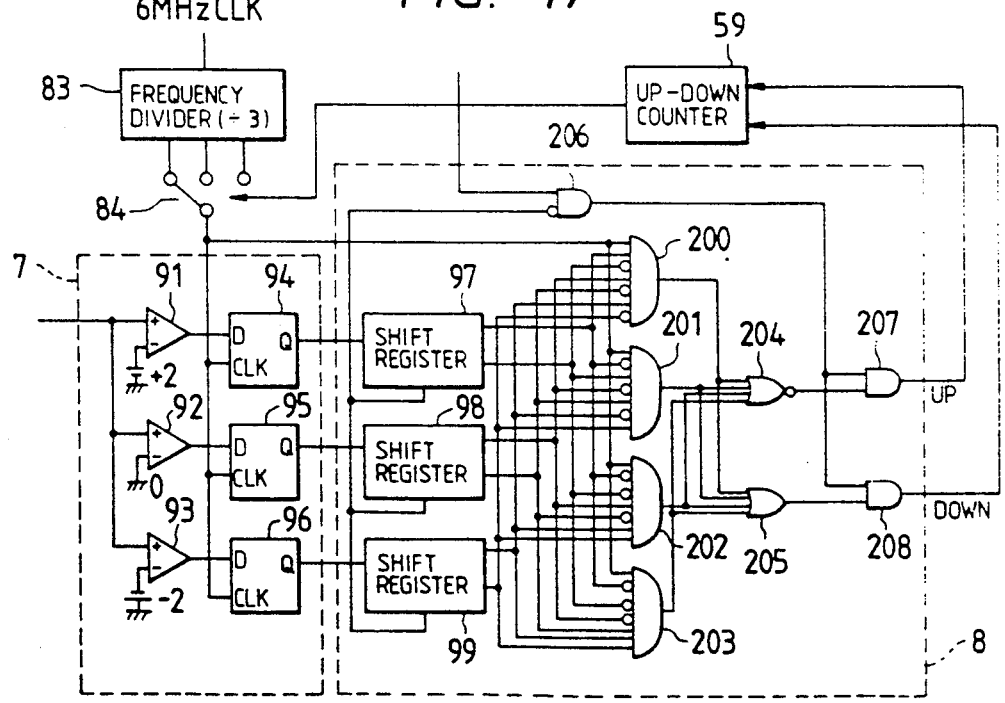
FIG. 17 is a circuit diagram showing the details of major portions in the circuit in FIG. 15.

FIG. 17 is a detailed diagram of the pattern selector 8 and the peripheral circuits thereof. They are constructed of the frequency divider 83, the switch 84, the discriminator 7, the pattern selector 8 and the up-down counter 59. The discriminator 7 is configured of comparators 91, 92, 93 and latches 94, 95, 96. Besides, the pattern selector 8 is configured of shift registers 97, 98, 99 and gates 200-208.

The output waveform 140 of the equalizer 9 is applied to the zero cross detector 2, whereby the zero cross timings 141 are output. The signal 141 has the three sorts of zero cross timings 153, 154 and 155. The PLL 3 produces the clock pulses 142 of 6 MHz, the trailing edges of which are synchronous to the timings 153, 154, and 155. The frequency of the clock pulses 142 is divided by 3 by the frequency divider 83, whereby the three trains of clock pulses 143, 144 and 145 of 2 MHz, the phases of which differ from one another, are generated. First, let's consider a case where the clock pulse train 143 is selected by the switch 84. The discriminator 7 discriminates data 146 in synchronism with the clock pulses 143, and sends the discriminated values to the shift registers 97, 98 and 99. Here, in a case where any of four sorts of patterns; "3, −3", "1, −1", "−1, 1" and "−3, 3" has been detected, the output of the gate 205 becomes the high level. Unless it is detected, the output of the gate 204 becomes the high level. Meanwhile, the gate 206 selects the pulses of the zero cross timings 141 which rise simultaneously with the falls of the clock pulses 143, thereby to deliver the enable signal 147. When the enable signal 147 is at the high level and also the output of the gate 205 is at the high level, the gate 208 delivers the non-error signal 149, and the content of the up-down counter 59 is decremented by 1. On the other hand when the enable signal 147 is at the high level and also the output of the gate 204 is at the high level, the gate 207 delivers the error signal 148, and the content of the up-down counter 59 is incremented by 1. This operation corresponds to the operation in which the discriminative values before and behind the clock pulse 143 are monitored to check if the correct pattern is discriminated. In accordance with the clock pulse train 143, the pulse is output on the side of the error signal 148, and the content of the up-down counter 59 increases. When the counter content exceeds a certain threshold value, a change-over signal is output to change-over the switch 84. When the clock pulse train 145 is selected, the discriminative values 150 and the enable signal 151 are produced, and the error signal 152 and the non-error signal 153 are output. Since the pulse is output on the side of the non-error signal 153, the content of the up-down counter 59 is settled to "0", and the switch 84 is stabilized. On this occasion, the leading edges of the clock pulses 145 are the correct discriminative points.

Figure 18:
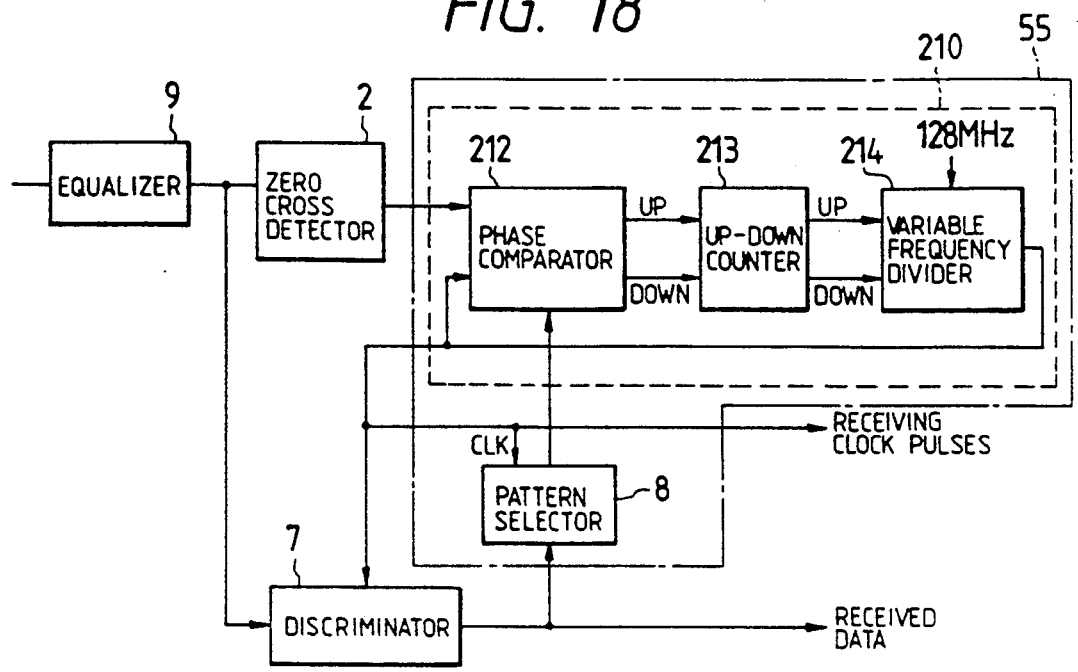
FIG. 18 is a block diagram showing the sixth embodiment of the distinguishing circuit of the present invention.

Now, the sixth embodiment of the distinguisher of the present invention will be described. This embodiment is applied to the 2B1Q code of 4 Mbps. In this embodiment, clock pulses of 2 Mhz are directly extracted. FIG. 18 is a block diagram showing the whole arrangement of this embodiment, which is constructed of an equalizer 9, a zero cross detector 2, a distinguishing circuit 55 and a discriminator 7. The distinguishing circuit 55 is configured of a DPLL 210 and a pattern selector 8. Besides, the DPLL 210 is constituted by a phase comparator 212, an up-down counter 213 and a variable frequency divider 214.

Figure 19:
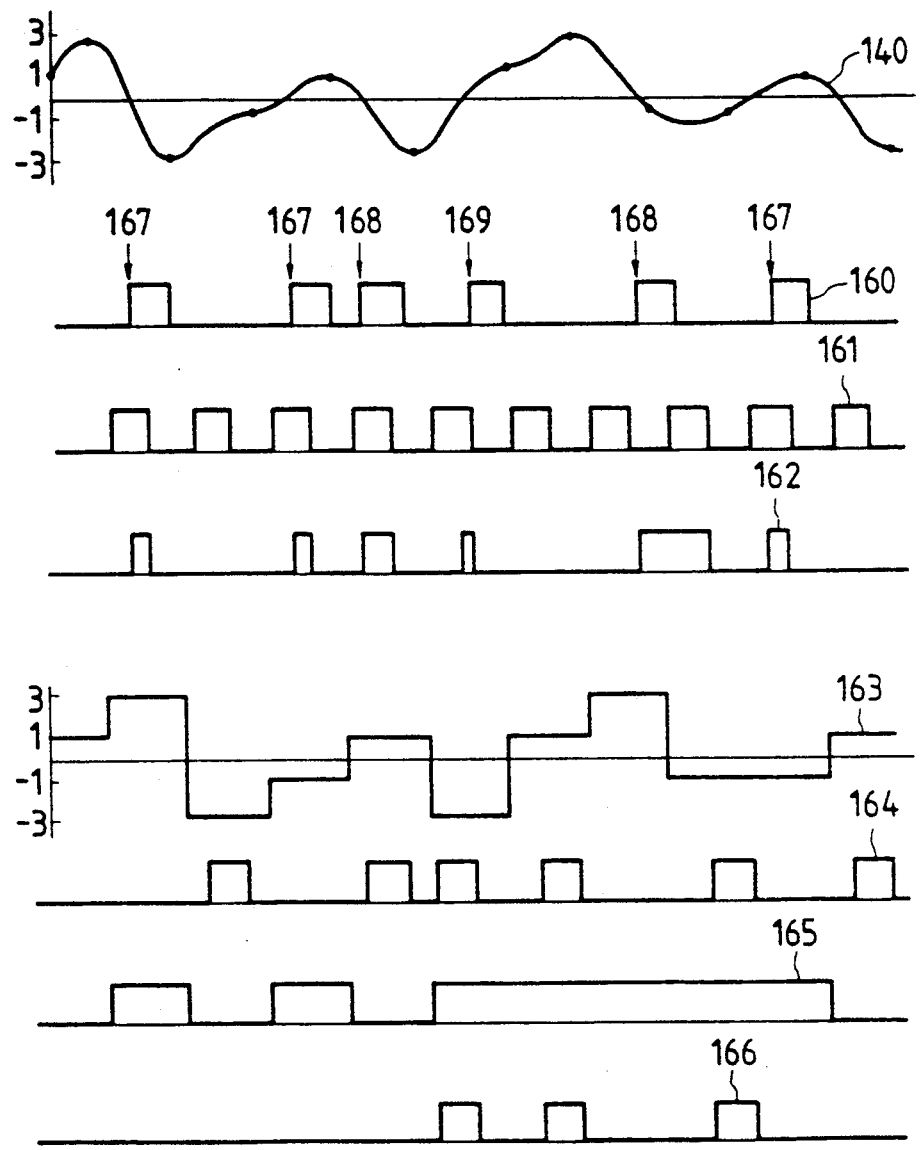
FIG. 19 is a signal timing chart for explaining the operation of the circuit in FIG. 18.

FIG. 19 is a timing chart illustrative of the operation of the FIG. 18 embodiment, in which numeral 140 designates an equalized waveform, numeral 160 a zero cross timing, numeral 161 the initial phase of clock pulses, numeral 162 a timing signal, numeral 163 values discriminated with the clock pulses 161, numeral 164 the delay of the zero cross timing 161 for one time slot, numeral 165 an enable signal, numeral 166 an error signal, and numerals 167-169 are timings.

Figure 20:
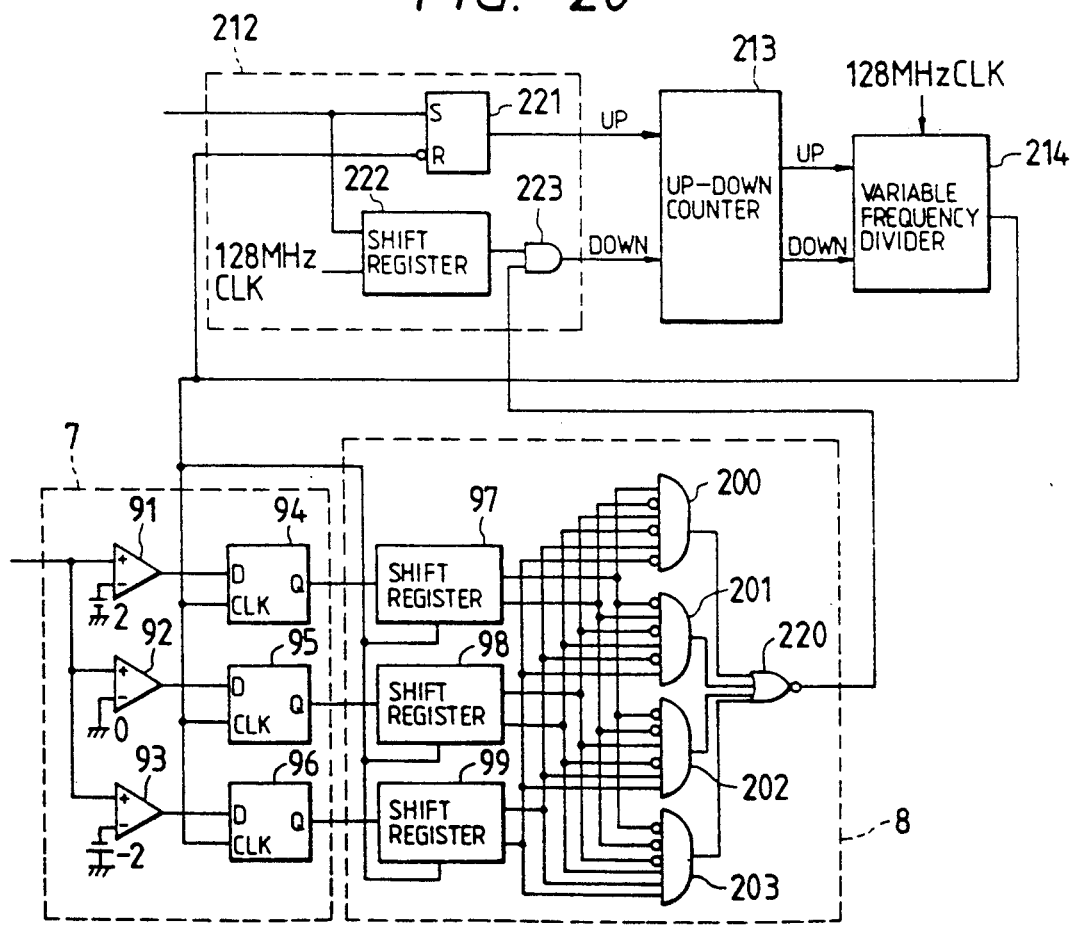
FIG. 20 is a circuit diagram showing the details of major portions in the circuit in FIG. 18.

FIG. 20 is a detailed diagram of the pattern selector 8, the phase comparator 212 and the peripheral circuits in FIG. 18. Numeral 7 indicates the discriminator, numeral 213 the up-down counter, and numeral 214 the variable frequency divider. The discriminator 7 is configured of comparators 91, 92, 93 and latches 94, 95, 96. The pattern discriminator 8 is configured of shift registers 97, 98, 99, and gates 200-203 and 220. Further, the phase comparator is configured of a flip-flop 221, a shift register 222 and a gate 223.

The output waveform 140 of the equalizer 9 is applied to the zero cross detector 2, whereby the zero cross timings 160 are output. Assuming that the initial phase of the 2 MHz-clock pulses is as indicated by numeral 161, the phase comparator 212 compares the zero cross timing 160 with the clock pulse 161 and delivers the timing signal 162. This processing is performed by the flip-flop 221, and the content of the up-down counter 213 is incremented in the number of pulses of the timing signal 162. When the content of the up-down counter 213 exceeds a certain threshold value, an UP signal is output, and the frequency division ratio of the variable frequency divider 214 is raised by one. By way of example, when the UP signal is received in the first state in which the frequency division ratio is 128 MHz/2 MHz=64, the frequency division ratio rises to 65, and the clock frequency lowers, so that the clock pulses proceed in a converging direction. On this occasion, however, the timing signal 162 contains three sorts of zero cross phases 167, 168 and 169. Since the timing phase with which the clock pulses are to be synchronized is only the phase 167, unnecessary pulses are removed in this embodiment by, for example, the following processing:

The discriminator 2 delivers the discriminative values 163 in synchronism with the clock pulses 161. Further, when the pattern selector 8 has detected a pattern other than the four sorts of patterns of "3, −3", "1, −1", "−1, 1" and "−3, 3", it delivers the enable signal 165. Meanwhile, the shift register 222 delays the zero cross timing 160 for one time slot, namely, 500 ns, thereby to produce the signal 164. The logical sum between the signal 164 and the enable signal 165 is the error signal 166, which is output from the gate 223. The number of pulses of the error signal 166 expresses the number of pulses erroneously counted, and the content of the up-down counter 213 is decremented in this number. In this embodiment, the number of pulses of the timing signal 162 is 6, and the number of pulses of the error signal 166 is 3, so that the difference between the two is 3. This agrees with the number of pulses synchronous to the desired timing phase 167. Owing to this function, the number of the pulses synchronous to the desired timing phase 167 is counted in the up-down counter 213. Accordingly, the DPLL 210 produces the clock pulses of 2 MHz synchronized with the timing phase 167 and becomes stable. This embodiment is effective especially in a case where it is not known, unless a certain period of time lapses since the detection of a zero cross, if the zero cross point is correct.

As understood from the above description, according to the present invention, it is possible to provide a timing extraction method which is applicable to all multilevel codes, which is applicable to high-speed transmission above several megabits per second and which is suited to the LSI implementation of a realizing circuit.

Figure 26:
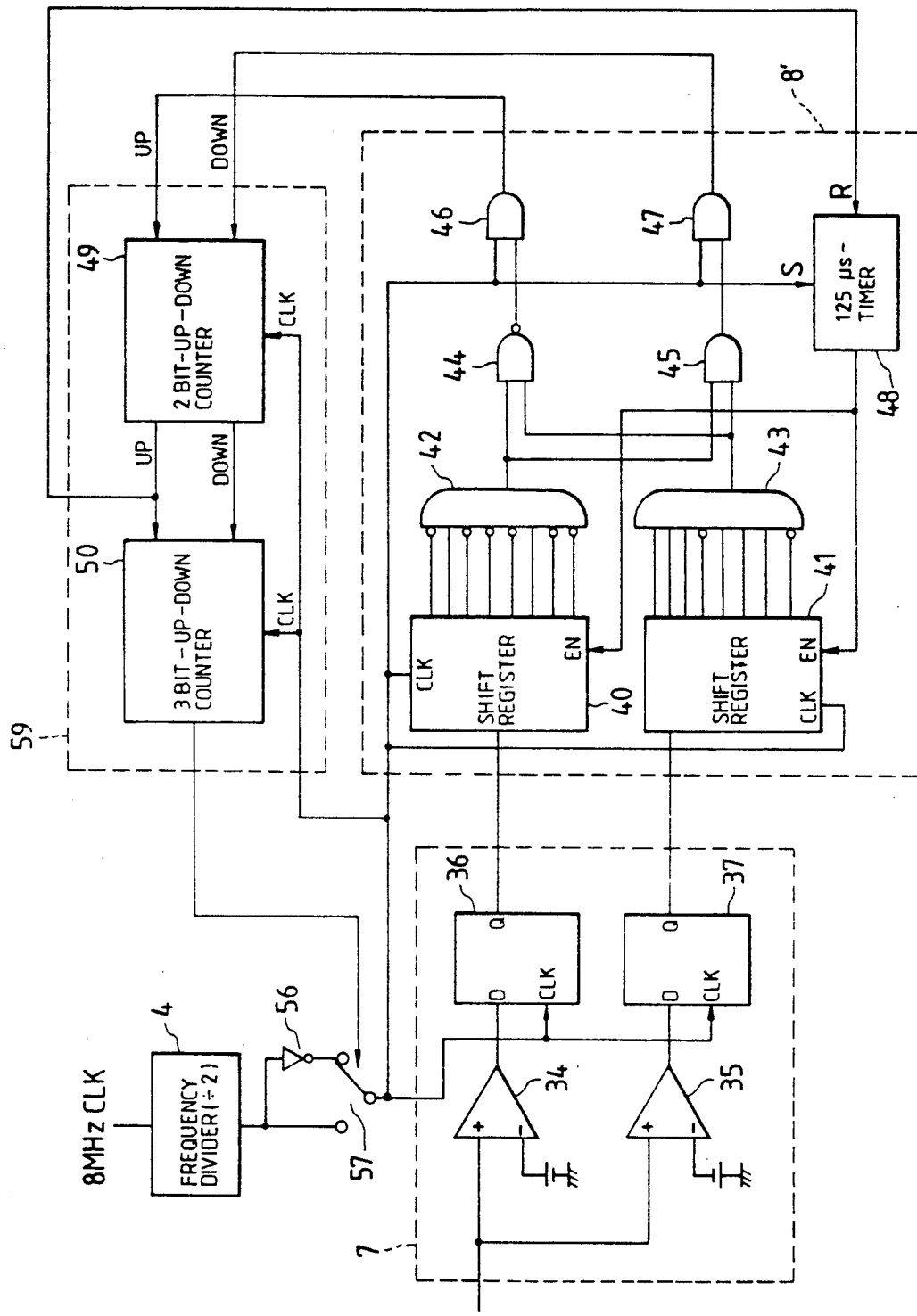
FIG. 26 shows another embodiment of the present invention.

In the FIG. 26 embodiment, whether the phase of clock pulses is correct or opposite is decided according to flags which are used for the discrimination of a transmission frame.

FIG. 26 shows the arrangements of the pattern selector 8' and the peripheral circuits thereof. The whole is constructed of a frequency divider 4, a NOT gate 56, a switch 57, a discriminator 7, the pattern selector 8' and an up-down counter 59. The discriminator 7 is configured of comparators 34, 35 and latches 36, 37, while the pattern selector 8' is configured of 8 bit-shift registers 40, 41, gates 42-47 and a 125 μs-timer 48. The up-down counter 59 is configured of a 2 bit-up-down counter 49 and a 3 bit-up-down counter 50.

Figure 27A:
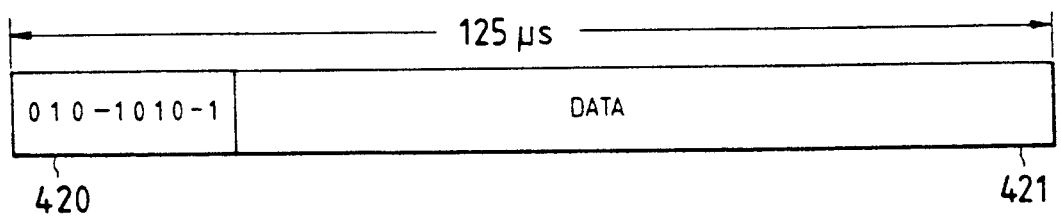
FIG. 27 (a) and (b) show frame formatting for the embodiment of FIG. 26.
Figure 27B:
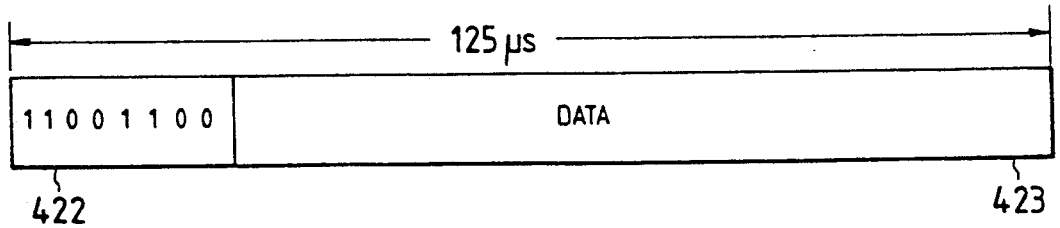

FIGS. 27(a) and (b) show the frame formats of one transmission cycle. Numeral 420 denotes a flag discriminated with correct clock pulses, numeral 421 data discriminated with the correct clock pulses, numeral 422 a flag discriminated with erroneous clock pulses, and numeral 423 data discriminated with the erroneous clock pulses.

Clock pulses of 8 MHz synchronized with the zero cross timings of a received waveform are converted into clock pulses of 4 MHz by the frequency divider 4. On this occasion, clock pulses in the opposite phase are also produced by the NOT gate 56. The switch 57 is controlled by the up-down counter 59, to select one of the two clock pulse trains which are opposite in phase to each other. The discriminator 7 discriminates data by means of the two comparators 34, 35, and latches it by means of the latches 36, 37 in accordance with the selected clock pulse train. Further, the flag which is sent at the head of a transmission frame is discriminated by the shift registers 40, 41 and the gates 42, 43.

In this embodiment, one frame has a length of 125 μs, and the flag "010-1010-1" (420) is located at the head of the frame. In a case where the flag pattern has been discriminated with the clock pulses being erroneous, it is not correctly read, and a pattern, for example, "11001100" (422) is detected. Assuming that the erroneous clock pulses have been first selected, the procedure of frame synchronization proceeds in the following sequence: When the correct pattern "010-1010-1" is received, the output of the gate 45 becomes the high level, and the 125 μs-timer 48 is set. Thenceforth, the shift registers 40, 41 can deliver data only at the intervals of 125 μs. Unless the correct flag can be received, the output of the gate 44 and subsequently that of the gate 46 become the high level, so that the content of the 2 bit-up-down counter 49 is incremented one by one. Unless the correct flag can be received 4 successive times, the up-down counter 49 produces an up signal so as to reset the timer 48. At the same time, it increments the content of the 3 bit-up-down counter 50 by 1. In this way, the establishment procedure of the frame synchronization is repeated. When the establishment procedure of the frame synchronization has failed 8 successive times, the up-down counter 50 produces a change-over signal to change-over the switch 57. Thus, the clock pulses being correct are selected. Insofar as the correct flag is successively received, the contents of the up-down counters 49, 50 hold "0", and the switch 57 is stable.

Figure 28:
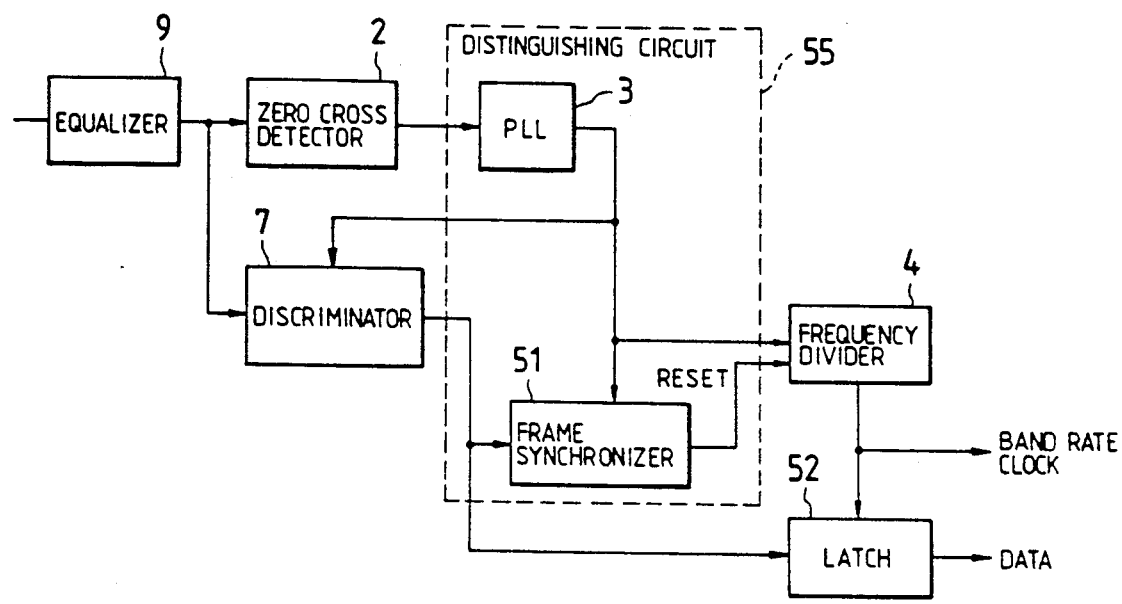
FIG. 28 shows another embodiment of the present invention.

FIG. 28 is a schematic diagram showing another embodiment of the present invention. The distinguishing circuit 55 is constructed of the PLL 3 and the frame synchronizer 51. The received signal is equalized at the equalizer 9 and the zero cross timings are extracted by the zero cross detector. The PLL 3 generates the (N−1) times clock synchronizing with the zero cross timings. The discriminator 7 discriminates binary data from the equalized signal at the (N−1) times clock timing. The binary data and the (N−1) times clock are sent to the frame synchronizer 51, and the reset signal is output at the instance when the frame synchronization is acquired. The frequency divider outputs the baud clock synchronizing with the reset signal from the (N−1) times clock. The latch 52 outputs binary data using the baud clock.

Figure 29:
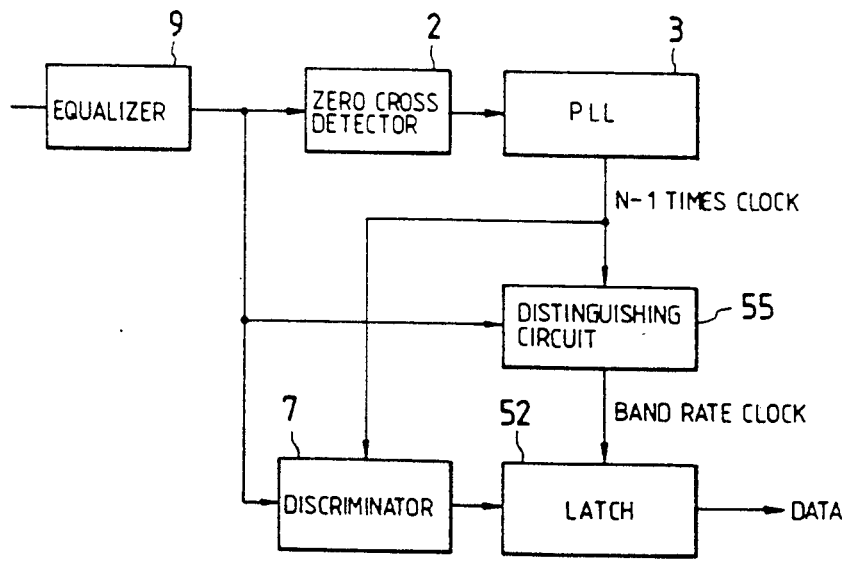
FIG. 29 shows another embodiment of the present invention.

FIG. 29 is a schematic diagram showing another embodiment of the present invention. The received signal is equalized at the equalizer 9 and the zero cross timings are extracted at the zero cross detector 2. The PLL 3 generates the (N−1) times clock synchronizing with the zero cross timings. The distinguishing circuit 55 generates the baud clock from the (N−1) times clock using the equalized signal.

The discriminator outputs the binary data at the (N−1) times timing and the latch outputs the binary data only at the baud rate timing.

As seen in the drawings of the various embodiments, preferably the PLL has only input signals of its own feedback signal and at least a part of the cross timing signal. According to FIGS. 5, 8, 15, 25, 28 and 29 the zero cross timings are directly fed to the PLL, whereas in FIGS. 10, 24, 13, and 23, the zero cross timings are fed to the PLL after first passing through a distinguisher.

While a preferred embodiment has been set forth along with modifications and variations to show specific advantageous details of the present invention, further embodiments, modifications and variations are contemplated within the broader aspects of the present invention, all as set forth by the spirit and scope of the following claims.

We claim:

1. A communication system for digital data communication between a plurality of terminal stations through a transmission medium, the communication system comprising:

transmission means for performing transmission of information data coded into a multilevel code signal having N (N being an integer greater than or equal to 3) levels through the transmission medium with a baud rate; and receiving means for receiving the information data from the transmission means through the transmission medium, the receiving means including, means for generating interim clock pulses having a frequency (N−1) times the baud rate and which interim clock pulses are synchronizing with a portion of crossing timings between a received multilevel code signal and a predetermined threshold level, means for selecting one of (N−1) trains of baud-rate clock pulses by discriminating a predetermined pattern with the (N−1) trains of the baud-rate, and extracting means for extracting the information data from the received multilevel code signal on basis of the one of (N−1) trains of baud-rate clock pulses.
t 2. A communication system according to claim 1, wherein said extracting means includes:

level discriminator outputting an interim data train which including the information data by discriminating the level of the received multilevel code signal at timings of the interim clocks, means for distinguishing one of said (N−1) trains of baud-rate clock pulses which indicate discriminative timings from other trains, and means for picking up data which are results of level discrimination in said level discriminator at said discriminative timings from said interim data train to output the information data.

3. A communication system according to claim 2, wherein said level discriminator outputs the interim data train decoded into binary code signals.

4. A communication system according to claim 2, wherein said picking-up means is a latch circuit latching the output of said level discriminator at timings indicated by said distinguishing means.

5. A communication system according to claim 1, wherein said extracting means includes:

means for distinguishing one of said (N−1) trains of baud-rate clock pulses which indicate discriminative timings from other trains, level discriminator discriminating the level of the received multilevel signal at said discriminative timings to output the information data.

6. A communication system for digital data communication between a plurality of terminal stations through a transmission medium, the communication system comprising:

transmission means for performing transmission of information data coded into a multilevel code signal having N (N being an integer greater than or equal to 3) levels through the transmission medium with a baud rate; and receiving means for receiving the information data from the transmission means through the transmission medium, the receiving means including, means for generating interim clock pulses having a frequency (N−1) times the baud rate and which interim clock pulses are synchronizing with a portion of crossing timings between a received multilevel code signal and a predetermined threshold level, and extracting means for extracting the information data from the received multilevel code signal on basis of one of (N−1) trains of baud-rate clock pulses obtained by using the interim clock pulses, wherein the one of (N−1) trains of baud-rate clock pulses is selected by changing the selection among the (N−1) trains of baud-rate clock pulses when an error signal is generated more frequently than a non-error signal.

7. A communication system for transmitting N (N being an integer greater or equal to 3) level code signals at a predetermined baud rate clock between a private branch exchanger and a plurality of terminal stations through a transmission medium, the communication system comprising:

a private branch exchanger which includes an interface circuit for transmitting the N level code signals so that crossing signals having crossing timings between the N level code signals and a predetermined threshold level are synchronizing with clock pulses having N−1 times frequency of the predetermined baud rate clock; and a plurality of terminal stations connected to the private branch exchanger via the transmission medium, each of the terminal stations including, means for detecting the crossing timings between the N level code signals received from the private branch exchanger and the predetermined threshold level, means for generating the clock pulses having N−1 times frequency of the predetermined baud rate clock, so that the clock pulses are synchronized with a portion of the crossing timings, means for generating a plurality of trains of baud rate clock pulses whose frequencies are equal to the baud rate, whose pulses are synchronous with a portion of the crossing timings and whose phases differ from one another according to being synchronous with different ones of the crossing timings by dividing the clock pulses having N−1 times frequency of the baud rate, means for discriminating information data with one of the trains of baud rate clock pulses and providing an output data pattern, and means for selecting the one of the trains of baud rate clock pulses by checking the output data pattern from the means for discriminating.

8. A communication system according to claim 7, wherein the selecting means includes, a detector detecting whether there is a predetermined data pattern within the output data pattern from the discriminating means, and a switch for selectively supplying the one of the trains of baud rate clock pulses to the means for discriminating according to a detecting result of the detector.

9. A communication system for transmitting N (N being an integer greater or equal to 3) level code signals at a predetermined baud rate clock between a private branch exchanger and a plurality of terminal stations through a transmission medium, the communication system comprising:

a private branch exchange which includes an interface circuit for transmitting the N level code signals so that crossing signals having crossing timings between the N level code signals and a predetermined threshold level are synchronizing with clock pulses having N−1 times frequency of the predetermined baud rate clock, the N level code signals having a frame synchronization pattern every predetermined data length; and a plurality of terminal stations connected to the private branch exchanger via the transmission medium, each of the terminal stations including, means for detecting the crossing timings between the N level code signals received from the private branch exchanger and the predetermined threshold level, means for generating the clock pulses having N−1 times frequency of the predetermined baud rate clock, so that a portion of the clock pulses is synchronized with the crossing timings, means for generating a plurality of trains of baud rate clock pulses whose frequencies are equal to the baud rate, whose pulses are synchronous with a portion of the crossing timings and whose phases differ from one another according to being synchronous with different ones of the crossing timings by dividing the clock pulses having $N-1$ times frequency of the baud rate, means for discriminating information data with one of the trains of baud rate clock pulses, and means for selecting the one of the trains of baud rate clock pulses and supplying the one of the trains of baud rate clock pulses to the discriminating means by checking whether output data from the means for discriminating includes the frame synchronization patterns.

10. A communication system for transmitting N (N being an integer greater or equal to 3) level code signals at a predetermined baud rate clock between a private branch exchanger and a plurality of terminal stations through a transmission medium, the communication system comprising:

a private branch exchanger which includes an interface circuit for transmitting the N level code signals so that crossing signals having crossing timings between the N-level code signals and a predetermined threshold level are synchronizing with clock pulses having $N-1$ times frequency of the predetermined baud rate clock; and a plurality of terminal stations connected to the private branch exchanger via the transmission medium, each of the terminal stations including, means for detecting the crossing timings between the N level code signals received from the private branch exchanger and the predetermined threshold level, means for generating the clock pulses having $N-1$ times frequency of the predetermined baud rate clock, so that the clock pulses are synchronizing with a portion of the crossing timings, means for generating a plurality of trains of baud rate clock pulses whose frequencies are equal to the baud rate, whose pulses are synchronous with a portion of the crossing timings and whose phases differ from one another according to being synchronous with different ones of the crossing timings by dividing the clock pulses having $N-1$ times frequency of the baud rate, means for discriminating interim data including information data with the clock pulses having $N-1$ times frequency of the predetermined baud rate clock, means for selecting one of the trains of baud rate clock pulses by checking every data pattern obtained by discriminating the interim data with every one of the trains of baud rate clock pulses, and means for discriminating information data obtained by latching the interim data with the one of the trains of baud rate clock pulses selected by the selecting means.

11. A communication system according to claim 10, wherein the means for selecting includes, a plurality of frame synchronizers for comparing a predetermined data pattern and every data pattern extracted from the interim data with every one of the trains of baud rate clock pulses, and a selector for selecting the one of the trains of baud rate clock pulses according to a result of comparison by every one of the frame synchronizers.

12. A communication system for transmitting N (N being an integer greater or equal to 3) level code signals at a predetermined baud rate clock between a private branch exchanger and a plurality of terminal stations through a transmission medium, the communication system comprising:

a private branch exchanger which includes an interface circuit for transmitting the N level code signals so that crossing signals having crossing timings between the N level code signals and a predetermined threshold level are synchronizing with clock pulses having $N-1$ times frequency of the predetermined baud rate clock, the N level code signals having a frame synchronization pattern every predetermined data length, and a plurality of terminal stations connected to the private branch exchanger via the transmission medium, each of the terminal stations including, means for detecting the crossing timings between the N level code signals received from the private branch exchanger and the predetermined threshold level, means for generating the clock pulses having $N-1$ times frequency of the predetermined baud rate clock, so that a portion of the clock pulses is synchronized with the crossing timings, means for discriminating interim data from N level code signals with the clock pulses having $N-1$ times frequency of the predetermined baud rate clock, means for comparing every one of plural data patterns obtained by de-interleaving the interim data and a predetermined frame synchronization data pattern, means for generating baud rate clock pulses from the clock pulses having $N-1$ times frequency of the baud rate clock according to a result of the means for comparing, and means for extracting information data from interim data with the baud rate clock.

* * * * *